United States Patent
Haga

(10) Patent No.: US 12,274,043 B2
(45) Date of Patent: Apr. 8, 2025

(54) RESIN MOLDED BODY, AND METHOD FOR MANUFACTURING SAME

(71) Applicant: Daicel Corporation, Osaka (JP)

(72) Inventor: Motoharu Haga, Tokyo (JP)

(73) Assignee: Daicel Corporation, Osaka (JP)

( * ) Notice: Subject to any disclaimer, the term of this patent is extended or adjusted under 35 U.S.C. 154(b) by 0 days.

(21) Appl. No.: 18/015,111

(22) PCT Filed: Jul. 8, 2021

(86) PCT No.: PCT/JP2021/025842
§ 371 (c)(1),
(2) Date: Jan. 9, 2023

(87) PCT Pub. No.: WO2022/009960
PCT Pub. Date: Jan. 13, 2022

(65) Prior Publication Data
US 2023/0255010 A1    Aug. 10, 2023

(30) Foreign Application Priority Data

Jul. 8, 2020   (JP) .................. 2020-117885
Jul. 8, 2020   (JP) .................. 2020-117923

(51) Int. Cl.
H05K 9/00    (2006.01)
H01F 27/28   (2006.01)

(52) U.S. Cl.
CPC ........... *H05K 9/0081* (2013.01); *H01F 27/28* (2013.01)

(58) Field of Classification Search
CPC .................................................. H05K 9/0081
See application file for complete search history.

(56) References Cited

U.S. PATENT DOCUMENTS 6,696,639 B1 *   2/2004   Nurmi ................. H05K 9/0015
                                                      174/363
2018/0197675 A1   7/2018   Kido
2019/0103216 A1   4/2019   Matsuda et al.
2019/0300379 A1   10/2019  Kojima et al.
2019/0326052 A1   10/2019  Sun et al.
2020/0020477 A1   1/2020   Kang et al.

FOREIGN PATENT DOCUMENTS

| CN | 106163247 A   | 11/2016 |
| JP | S60-260108 A  | 12/1985 |
| JP | 2009-060060 A | 3/2009  |
| JP | 2011-086930 A | 4/2011  |
| JP | 2015-220272 A | 12/2015 |

(Continued)

OTHER PUBLICATIONS

International Search Report issued in corresponding International Patent Application No. PCT/JP2021/025842 dated Oct. 5, 2021.

(Continued)

*Primary Examiner* — Hung V Ngo
(74) *Attorney, Agent, or Firm* — Morgan, Lewis & Bockius LLP

(57) ABSTRACT

A resin molded body includes: resin; and a conductive member having a coil shape with a center axis; with a flat surface in at least part of the resin molded body, in which an average angle between the flat surface and the center axis is 50° or greater.

29 Claims, 30 Drawing Sheets

(56) References Cited

FOREIGN PATENT DOCUMENTS

| JP | 2018-073897 | A  | 5/2018  |
|----|-------------|----|---------|
| JP | 2019-067883 | A  | 4/2019  |
| JP | 2019-067997 | A  | 4/2019  |
| KR | 20140038664 | A  | 3/2014  |
| WO | 2007/108478 | A1 | 9/2007  |
| WO | 2017/212997 | A1 | 12/2017 |

OTHER PUBLICATIONS

Written Opinion issued in corresponding International Patent Application No. PCT/JP2021/025842 dated Oct. 5, 2021.
Extended European Search Report issued in the corresponding Application No. 21837546.7, dated Jun. 26, 2024.
English translation of Office Action issued in counterpart Japanese Patent Application No. 2022-535390 dated Dec. 17, 2024.

* cited by examiner

RESIN MOLDED BODY, AND METHOD FOR MANUFACTURING SAME

TECHNICAL FIELD

The present invention relates to a resin molded body and a method for manufacturing the same.

BACKGROUND ART

Communication devices such as cell phones and smartphones can perform wireless communications using electromagnetic waves. The frequency band of the electromagnetic waves used is widening with advancement of the technique of this field.1 In particular, development has been underway for the purpose of achieving high speed, great capacity, and short delay for communication devices. To achieve such a purpose, the use of electromagnetic waves in a high frequency band has been attracting attention. On the other hand, there has been a concern that the use of electromagnetic waves in a high frequency results in a higher risk of malfunctioning of general electronic devices, because such electronic devices are susceptible to the electromagnetic waves. As one solution for such a problem, an electromagnetic wave shield that can block electromagnetic waves may be used. Through a measure such as surrounding an electronic device with the electromagnetic wave shield, the impact of the electromagnetic waves from the periphery can be reduced, whereby the malfunctioning can be prevented.

The electromagnetic wave shield includes various types of shields, and has been widely studied. A report as a result of such study indicates that it is effective to use a material having a structure with a size one order smaller than the wavelength of the electromagnetic waves to be blocked. To form such a structure, development of a material containing small fillers has been underway.

Patent Document 1 discloses an electromagnetic wave shield exhibiting excellent electromagnetic wave shielding property for a frequency of 1 GHz. The shield is a composite of an insulating layer and a conductive layer in which binder resin contains flaky silver powder having a predetermined particle size and bulk density. Patent Document 2 discloses an electromagnetic wave shield that can block electromagnetic waves in a frequency band from 1 MHz to 1 GHz. The shield is a composite in which binder resin contains single crystal ferrite particles having a predetermined average particle size and a spherical particle shape. Patent Document 3 discloses an electromagnetic wave shield that can block electromagnetic waves in a frequency band from 18.0 to 26.5 GHz. The shield is a composite in which binder resin contains a predetermined amount of nickel nanowire or greater. The shield features excellent handleability and flexibility.

PRIOR ART DOCUMENTS

Patent Documents

[Patent Document 1] JP 2011-86930 A
[Patent Document 2] WO 2017/212997
[Patent Document 3] JP 2019-67997 A

SUMMARY OF THE INVENTION

Problems to be Solved by the Invention

For communication devices such as cell phones and smartphones, a wireless communication system conforming to the IMT-Advanced standard defined by the International Telecommunication Union (ITU) has been defined. The frequency band, which has been the 800 MHz band for the first generation mobile communication system (1G), has widened to the 3 GHz band in the fourth generation mobile communication system (4G). The frequency band has been further widened to the 28 GHz band for the fifth generation mobile communication system (5G) currently adopted. Currently, development has been underway for the next generation communication system, namely, the sixth generation mobile communication system (6G) using a frequency band of 100 GHz or higher.

The electromagnetic wave shields disclosed in Patent Documents 1 to 3 described above cannot block electromagnetic waves in a frequency band used in the next generation wireless communication system, which is one order higher than the frequency bands that have been used in the wireless communication systems adopted so far. In view of this, development of high performance electromagnetic wave shields that may block the electromagnetic waves in such a frequency band is demanded.

Thus, an object of the present invention is to provide a resin molded body (an electromagnetic wave shielding sheet in particular) that can block electromagnetic waves in a high frequency band, and a method for manufacturing the same.

Means for Solving the Problems

Through diligent study, the present inventors have found out that the object described above can be achieved by using a molded body in which resin contains a conductive member having a coil shape, and thus has arrived at the present invention.

[1] A resin molded body including:
resin; and
a conductive member having a coil shape with a center axis; with a flat surface in at least part of the resin molded body, in which
an average angle between the flat surface and the center axis is 50° or greater.
[2] The resin molded body according to [1], in which the coil shape is a spiral shape.
[3] The resin molded body according to [2], in which the conductive member is a metal coil.
[4] The resin molded body according to [1], in which the conductive member includes a plurality of C-shaped conductive materials, and a column-shaped conductive material coupling end portions of the plurality of C-shaped conductive materials in a direction of the center axis.
[5] The resin molded body according to any one of [1] to [4], in which a content of the conductive member in the resin molded body is 0.00040 g/cm$^3$ or greater and 5.50 g/cm$^3$ or less.
[6] The resin molded body according to any one of [1] to [5], in which the resin molded body has a sheet shape.
[7] The resin molded body according to [6], in which the resin molded body is an electromagnetic wave shielding sheet.
[8] A method for manufacturing a resin molded body that includes resin and a conductive member having a coil shape with a center axis, with a flat surface in at least part of the resin molded body, the method including:
preparing a resin member including a pocket and a flat surface in at least part of the resin member;
arranging, in the pocket, the conductive member oriented; and pouring a composition including resin into the pocket in which the conductive member is arranged, and then curing the composition, in which an average angle between the flat surface and the center axis is 50° or greater.

[9] A method for manufacturing a resin molded body that includes resin and a conductive member having a coil shape with a center axis, with a flat surface in at least part of the resin molded body, the method including:
preparing a plurality of resin sheets each including the resin, a C-shaped conductive material, and a column-shaped conductive material connected to an end portion of the C-shaped conductive material; and
layering the plurality of resin sheets, with the end portion of the C-shaped conductive material in one of the sheets being in contact with the column-shaped conductive material in another one of the sheets in a direction of the center axis.

[10] A method for manufacturing a resin molded body that includes resin and a conductive member having a coil shape with a center axis, with a flat surface in at least part of the resin molded body, the method including:
preparing a composition including a resin composition including the resin and the conductive member;
orienting the conductive member to achieve an average angle of 50° or greater between a flat surface direction of the sheet and the center axis; and
curing the resin composition including the conductive member while holding the orientation of the conductive member.

[11] The method for manufacturing the resin molded body according to any one of [8] to [10], in which the resin molded body has a sheet shape.

[12] The method for manufacturing the resin molded body according to [11], in which the resin molded body is an electromagnetic wave shielding sheet.

[13] A resin molded body including: resin; and a conductive coil, in which a conductive member forming the conductive coil has a spiral shape.

[14] The resin molded body according to [13], in which a content of the conductive coil in the resin molded body is 0.02 g/cm$^3$ or greater and less than 5.00 g/cm$^3$.

[15] The resin molded body according to [13] or [14], in which the resin molded body has a sheet shape.

[16] The resin molded body according to [15], in which the resin molded body is an electromagnetic wave shielding sheet.

[17] A method for manufacturing a resin molded body that includes resin and a conductive coil, the method including: preparing a composition including a resin composition including the resin and the conductive coil, and then curing the composition, in which
a conductive member forming the conductive coil has a spiral shape.

[18] The method for manufacturing the resin molded body according to [17], in which the resin molded body has a sheet shape.

[19] The method for manufacturing the resin molded body according to [18], in which the resin molded body is an electromagnetic wave shielding sheet.

[20] A composition for a resin molded body including:
resin; and
a conductive coil, in which
a conductive member forming the conductive coil has a spiral shape.

[21] The composition for the resin molded body according to [20], in which the composition is a composition for an electromagnetic wave shielding sheet.

[22] An electric communication device including the resin molded body according to any one of [1] to [7] and [13] to [16].

[23] A consumer electronic device including the resin molded body according to any one of [1] to [7] and [13] to [16].

[24] An automobile device including the resin molded body according to any one of [1] to [7] and [13] to [16].

[25] A medical device including the resin molded body according to any one of [1] to [7] and [13] to [16].

[26] An aerospace device including the resin molded body according to any one of [1] to [7] and [13] to [16].

[27] A defense device including the resin molded body according to any one of [1] to [7] and [13] to [16].

[28] A system including the resin molded body according to any one of [1] to [7] and [13] to [16].

[29] A digital weapon including the resin molded body according to any one of [1] to [7] and [13] to [16].

Effect of the Invention

The present invention can provide a resin molded body (an electromagnetic wave shielding sheet in particular) that can block electromagnetic waves in a high frequency band, and a method for manufacturing the same. In particular, in certain aspects, the resin molded body is advantageous for blocking electromagnetic waves at a frequency of 100 GHz or higher. In certain aspects, the resin molded body is advantageous for blocking electromagnetic waves at a frequency of 100 GHz or higher, in a frequency band from 200 to 400 GHz on a high frequency side used for 5G and 6G, and in an even higher frequency band expected to be used for generations after 6G.

MODE FOR CARRYING OUT THE INVENTION

Figure 1:
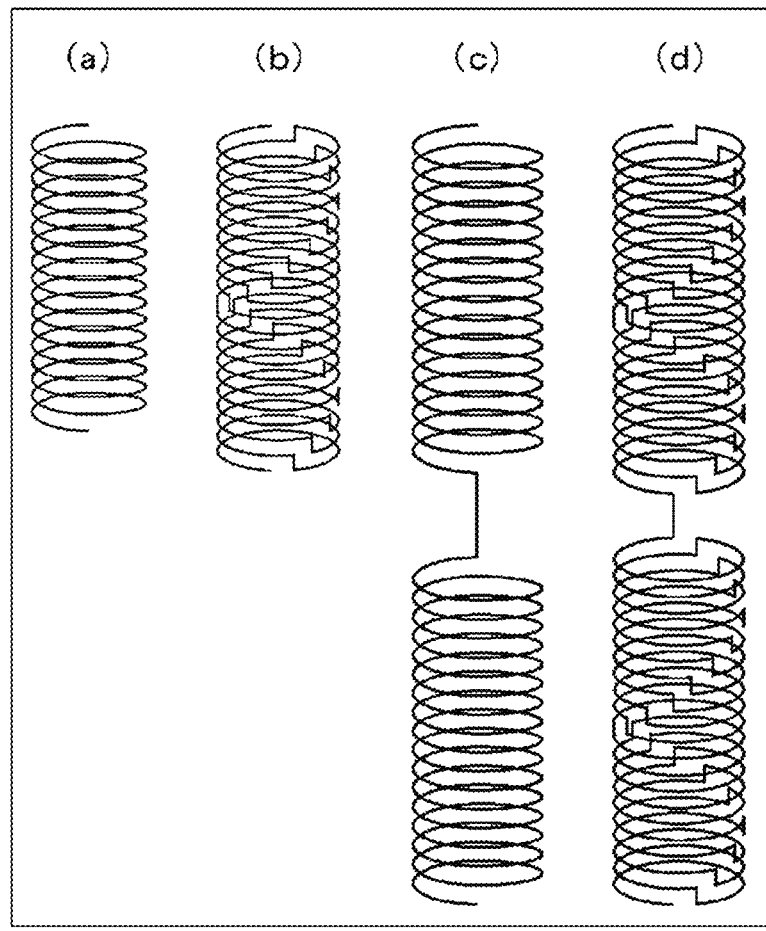
FIG. 1 is a diagram schematically illustrating a mode of a conductive member.

Hereinafter, although embodiments of the present invention will be described in detail, each of the configurations, combinations thereof, and the like in each embodiment are an example, and various additions, omissions, substitutions, and other changes may be made as appropriate without departing from the spirit of the present invention. The present disclosure is not limited by the embodiments and is limited only by the claims.

In the present disclosure, a numerical range expressed by "to" implies a range including the numerical values described before and after "to" as the lower limit value and the upper limit value. Specifically, "A to B" implies a value that is A or greater and B or less.

In addition, in the present disclosure, "a plurality of" implies "two or more".

<First Resin Molded Body>

A first resin molded body is described below in detail.

<Configuration and Characteristics of Resin Molded Body>

A first resin molded body (also simply referred to as a "resin molded body" in the description of the present embodiment) that is an embodiment of the present disclosure is a resin molded body including: resin; and a conductive member having a coil shape with a center axis; with a flat surface in at least part of the resin molded body, in which an average angle between the flat surface and the center axis is 50° or greater.

The present inventors have focused on a coil shape with a center axis as a structure with which strong electromagnetic waves in a terahertz range can be absorbed. With a material with the coil shape, polarized light can be controlled. When the incident electromagnetic waves that are linearly polarized light enter the material with the coil shape, the polarized light is converted into an elliptically polarized light to be emitted. Thus, the material with the coil shape can be used for controlling the polarized light. In the present embodiment, the magnitude of electromagnetic wave absorption by the coil shape is focused instead of the control of the polarized light.

Furthermore, the present inventors have focused on the fact that one winding of the coil shape described above can be regarded as an LC resonance circuit. In this case, considering the transmittance of the material with the coil shape, the electromagnetic wave absorption effect through LC resonance can be achieved with C being the capacitance of a gap in the coil shape and L being the inductance of the coil shape itself. Thus, increase in the winding number of the coil shape is expected to lead to improvement in the electromagnetic wave absorption effect.

The electromagnetic wave absorption effect through the LC resonance described above also has a huge impact on the angle between the center axis of the coil shape and the electromagnetic waves. Specifically, when the angle is 90°, the electromagnetic wave absorption effect is small. On the other hand, when the angle is 0°, the electromagnetic wave absorption effect is large.

The present inventors have focused on the points described above, and have found out that a resin molded body member (a sheet member in particular) can be prepared that has excellent electromagnetic wave shielding property for electromagnetic waves at high frequencies, with a configuration in which a conductive member having a coil shape is contained in resin (sheet-shaped resin in particular) at least part of which has a flat surface, with an average value of an angle between the center axis of the coil shape and a direction of the flat surface being a predetermined angle or larger, and thus completed the present invention.

Unless particularly noted, in the present disclosure, a description is given assuming that the direction of external electromagnetic waves is a direction perpendicular to the direction of the flat surface (sheet flat surface in particular) of the resin molded body (electromagnetic wave shielding sheet in particular) including the flat surface in at least a part thereof.

The shape of the resin molded body is not particularly limited as long as at least part of which has a flat surface. The position of the flat surface is not particularly limited. Still, the resin molded body is preferably formed with the normal direction of the flat surface matching the incident direction of external electromagnetic waves. When the resin molded body is mounted on another member to be used, the resin molded body is preferably formed to have the flat surface serving as a surface for the mounting on the other member.

Examples of the specific shape of the resin molded body include a sheet shape, a spherical shape at least part of which has a flat surface, and a column shape such as circular column shape or a polygonal column shape at least part of which has a flat surface. Among these, the sheet shape is preferable in terms of handleability.

When the sheet shape is employed, the resin molded body according to the present embodiment can be expressed as a resin molded body that is an electromagnetic wave shielding sheet including resin and a conductive member having a coil shape with the center axis, in which the average angle between the flat surface of the sheet and the center axis is 50° or greater.

The applications of the resin molded body described above are not particularly limited, and include an electromagnetic wave shield, for example. A mode of the resin molded body having the sheet shape, particularly, a mode of the electromagnetic wave shielding sheet will be described below in detail. The flat surface of the sheet described below corresponds to the flat surface that at least part of the resin molded body in the present embodiment has. The conditions of the following mode are applicable to conditions of a mode of a shape other than sheet, without departing from the range of applicability.

[Conductive Member]
(Configuration of Conductive Member)

The conductive member is not particularly limited as long as it has a coil shape with a center axis. The coil shape in the present disclosure is a shape formed by a structure surrounding the center axis and a structure extending in the center axis direction, or is a shape formed by a structure extending along the center axis direction while surrounding the center axis. The surrounding structure may be a structure having a circular circumference shape, or may be a structure having a polygonal circumference shape. Examples of a specific mode of the coil shape include a spiral shape with a center axis as illustrated in FIG. 1, (a), a shape formed by a plurality of C-shaped structures and a column-shaped structures coupling the plurality of C-shaped structures in the center axis direction as illustrated in FIG. 1, (b). Specifically, FIG. 1, (b) illustrates a shape similar to a coil shape as a whole formed by repetition of a structure in which the column-shaped structure has an end portion coupled to an end portion of the C-shaped conductive material and has the other end portion coupled to an end portion of another C-shaped conductive material.

As illustrated in FIG. 1, (c) and FIG. 1, (d), these conductive materials having the coil shape may or may not be coupled to each other by a conductive material having a linear shape.

The conductive member is not limited to one with a linear center axis, and may be one with a center axis that may be approximate to a linear line. When the conductive member has the center axis that may be approximate to a linear line, the center axis is expressed by the approximate linear line.

When the coil shape of the conductive member is the spiral shape with the center axis as illustrated in FIG. 1, (a), the mode thereof is not limited as long as it has conductivity, and a metal coil may be used for example.

A material having a spiral shape with the center axis includes ones with the winding direction not limited, that is, wound both clockwise and counterclockwise, but metal coils can be industrially produced to have a single winding direction. With a material wound both clockwise and counterclockwise, the electromagnetic wave shielding effects offset each other, resulting in a low electromagnetic wave shielding effect as a whole. Such an offset does not occur with a material produced to have a single winding direction. Furthermore, in the case of a metal coil, the size of the metal coil can be precisely designed, meaning that the oscillation frequency can be accurately controlled. Thus, there is also an advantage that the metal coil can be used as an absorber at various frequencies. There is also an advantage that the metal coil can be easily aligned in a desired arrangement, and thus it is likely to obtain high absorbing performance in a certain direction. On top of that, there is an advantage that the metal coil can be easily mass produced as a metamaterial.

The cross-sectional shape of the line forming the spiral shape is not particularly limited, and may be, for example, a circle or a polygonal shape such as a triangle or a rectangle. Preferably, the cross-sectional shape is a circle and thus it can be obtained or manufactured easily.

A plurality of parts having the spiral shape may be coupled to each other as illustrated in FIG. 1, (c). The center axes of the spiral shaped parts thus coupled to each other may not be coaxially arranged. In such a coupled mode, each of the parts with the spiral shape is regarded as a single conductive member. An angle between the center axis of each of the conductive members and the flat surface of the sheet described above is calculated.

When the coil shape of the conductive member is a shape including the plurality of C-shaped conductive structures and the column-shaped structures coupling these C-shaped structures in the center axis direction as illustrated in FIG. 1, (b), the mode of such a shape is not particularly limited. For example, as described below with reference to a manufacturing method, the mode includes a mode in which the part of the C-shaped structures is made of a conductive thin film and the part of the column-shaped structures coupling the plurality of C-shaped conductive structures is made of a column-shaped conductive material.

The C shape may be a circular ring partially notched as illustrated in FIG. 1, (b). The shape of this ring may also be a polygonal shape, such as a triangle or a rectangle, partially notched. Still, the C shape is preferably a circular ring partially notched, and thus it can be easily obtained or manufactured. In any of the modes, as long as the center axis is provided, the electromagnetic wave absorption effect through the LC resonance based on external electromagnetic waves can be achieved.

The column shape is not particularly limited, and may be a circular column shape or a polygonal column shape such as a triangular column shape or a rectangular column shape. Preferably, the column shape is a circular column shape, and thus it can be obtained or manufactured easily.

The C-shaped structure part and the column-shaped structure part may be made of the same material or different materials. Preferably, they are made of the same material, for the sake of lower manufacturing cost.

As in FIG. 1, (c) described above, the shapes in FIG. 1, (b) may be coupled to obtain a shape illustrated in FIG. 1, (d). In such a case, the angle described above is calculated by a method similar to that in FIG. 1, (c).

The type of material of the conductive member is not particularly limited as long as it has conductivity. Examples of the material include a carbon material such as carbon, as well as copper (Cu), aluminum (Al), iron (Fe), gold (Au), silver (Ag), platinum (Pt), magnesium (Mg), zinc (Zn), tungsten (W), titanium (Ti), nickel (Ni), or manganese (Mn), an alloy that is a combination of these metal elements, or an oxide of these metal elements or an alloy of these, a metal-containing compound such as a halide or a sulfide. Preferably copper (Cu) and iron (Fe) are used, and more preferably, tungsten (W) is used, for the sake of durability of the resin sheet since these are elements that have an elastic modulus suitable for coil processing and, when mixed in resin, achieve a high corrosion resistance and a small coefficient of linear expansion.

The content of the conductive member in the sheet is not particularly limited. The content per volume of the sheet is typically 0.00040 $g/cm^3$ or greater, preferably 0.001 $g/cm^3$ or greater, more preferably 0.01 $g/cm^3$ or greater, further preferably 0.05 $g/cm^3$ or greater, particularly preferably 0.075 $g/cm^3$ or greater, and most preferably 0.10 $g/cm^3$ or greater, and is typically 5.50 $g/cm^3$ or less, preferably 3.00 $g/cm^3$ or less, more preferably 1.00 $g/cm^3$ or less, further preferably 0.50 $g/cm^3$ or less, further preferably 0.30 $g/cm^3$ or less, and further preferably 0.26 $g/cm^3$ or less, for the sake of higher electromagnetic wave shielding property.

In the electromagnetic wave shield of the present embodiment, the average angle between the center axis of the conductive member and the flat surface of the sheet is a predetermined angle or greater. Thus, superior electromagnetic wave shielding property can be achieved compared with an electromagnetic wave shield manufactured with the content of the conductive member that is the same as that in the embodiment and without orientating the conductive member. Thus, when the same electromagnetic wave shielding property is to be obtained with the electromagnetic wave shield of the present embodiment and the electromagnetic wave shield manufactured without orientating the conductive member, the electromagnetic wave shield of the present embodiment can be obtained with a smaller amount of the conductive member used. Typically, the price per volume of the conductive member is higher than that of resin. Thus, the electromagnetic wave shield of the present embodiment can be obtained with a lower material cost than the electromagnetic wave shield manufactured without orientating the conductive member.

Figure 2:
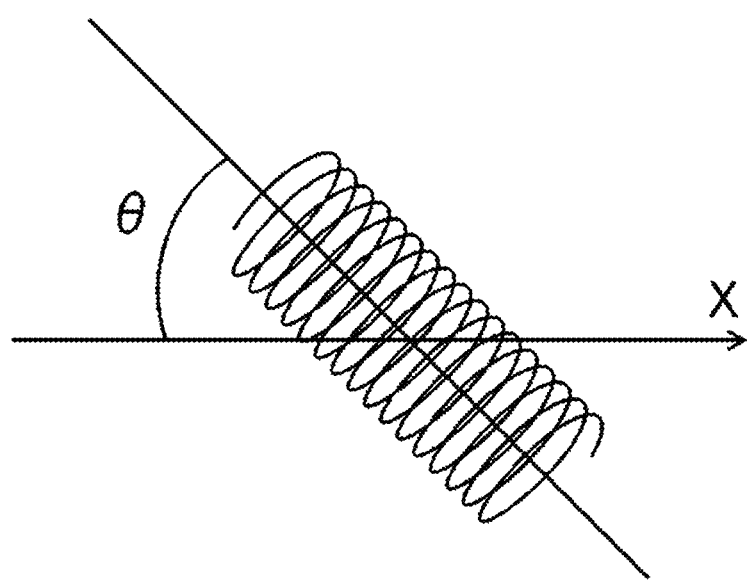
FIG. 2 is a diagram for explaining an angle θ formed between a center axis of the conductive member and a flat surface of a sheet.

The angle between the center axis of the conductive member and the flat surface of the sheet is $\theta$ in FIG. 2. An arrow X in FIG. 2 indicates the flat surface direction of the sheet. FIG. 2 illustrates a mode of the conductive material having the spiral shape with the center axis illustrated in FIG. 1, (a). Note that the angle between the center axis of the conductive member and the flat surface of the sheet is obtained in a similar manner for other modes.

A larger angle $\theta$ described above leads to a larger electromagnetic wave absorption effect through the LC resonance based on external electromagnetic waves, resulting in larger electromagnetic wave shielding effect. Particularly higher electromagnetic wave shielding property can be obtained with the angle being 50° or greater.

For the sake of guaranteeing sufficient electromagnetic wave shielding property, the average angle between the flat surface of the sheet and the center axis may be any angle being 50° or greater. Specifically, the average angle is preferably 60° or greater, more preferably 70° or greater, even more preferably 80° or greater, particularly preferably 85° or greater, and is logically most preferably 90°. The average angle is an average value of angles between the center axes obtained with the conductive members in the sheet and the flat surface of the sheet.

The angles described above can be measured by internal observation using CT-X rays.

When a plurality of the conductive members are used, the arrangement of the conductive members is not particularly limited, but preferably forms a metamaterial structure for the sake of guaranteeing sufficient electromagnetic wave shielding property. The metamaterial structure of the present embodiment is a mode in which the conductive members are arranged in an aligned manner in the resin. More specifically, it implies a mode in which the conductive members are arranged at a periodic interval in the resin. The mode of the alignment is not particularly limited, and includes modes in which the conductive members are arranged in an aligned manner to form a circular shape, or a polygonal shape such as a triangular or rectangular shape. The arrangement in an aligned manner may be formed by a single stage or may be formed by two or more stages.

Figure 3:
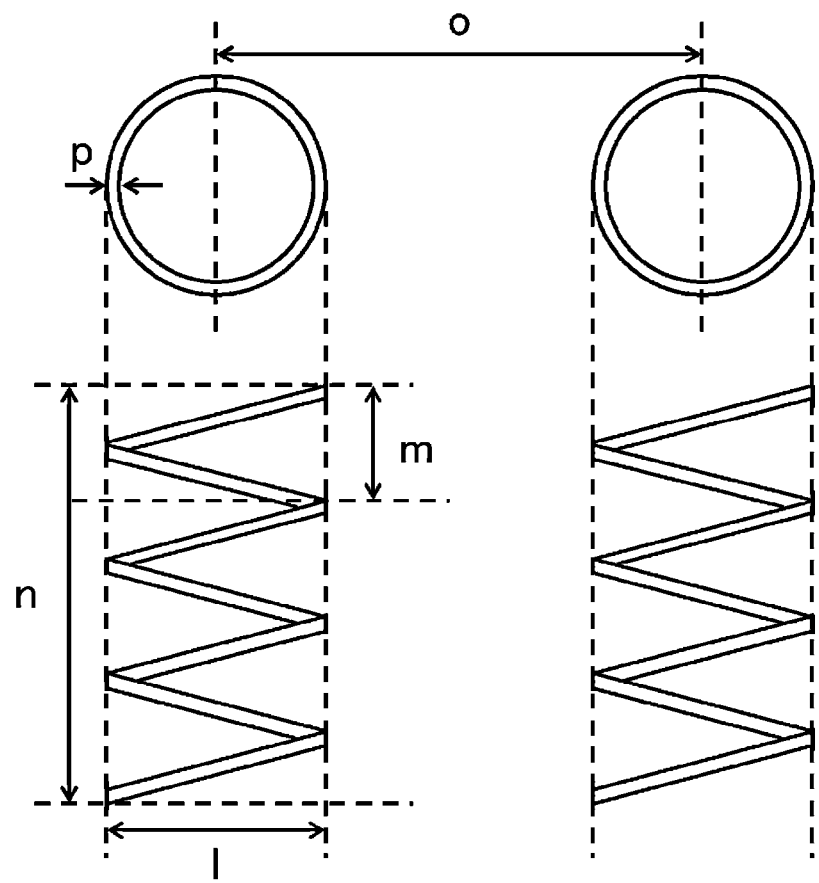
FIG. 3 is a diagram for explaining an aspect of the conductive member.

FIG. 3 illustrates a mode in which two conductive members with the angle $\theta$ being 90° are arranged in parallel in the resin. An upper diagram in FIG. 3 illustrates the conductive members observed in the direction of the center axis of the conductive members, and a lower diagram in FIG. 3 illustrates the conductive members observed in a direction at 90° relative to the center axis. In FIG. 3, 1 represents the average outer diameter in a case where the metal member shape is a coil shape, m represents an average winding pitch width of the coil shape, n represents the average length of the coil-shaped portion of the conductive member in the center axis direction, o represents an average coil alignment pitch, and p represents the average wire diameter of the coil shape. When a plurality of conductive members are used, the average outer diameter 1 is a value calculated as the average value of the plurality of conductive members. In the present disclosure, when the term "average" is used for a parameter of the conductive member, calculation is performed for other parameters in a manner similar to that for the average outer diameter. These parameters and the average winding number of the coil shape of the conductive member can both be measured by internal observation using CT-X rays. While the term "coil" is added to the above parameters, but the parameters are not limited to coils, and are parameters for the coil-shaped conductive member.

The average coil alignment pitch is a parameter set when the conductive members are arranged at an equal interval, and the length of the interval is the average coil alignment pitch. For example, when the coils are arranged in the flat surface direction, it is assumed that lines forming a lattice shape with square cells are assumed to be arranged on the sheet, with a plurality of vertical lines formed at an equal interval and a plurality of lateral lines formed at an equal interval, and with the interval between the vertical lines and the interval between the lateral lines being the same. In this case, the interval between the vertical lines (or lateral lines) with one conductive material included in each square cell is the average coil alignment pitch. The conductive members may be arranged at an equal interval, with the length of the interval varying among a plurality of directions. For example, the conductive members may be arranged at an equal interval with a length X of the interval in the vertical direction and at an equal interval with a length Y of the interval in the lateral direction. In other words, the average coil alignment pitch may be determined with lines forming a lattice shape with rectangular cells in place of the square cells described above, and in this case, the average value of X and Y is the average coil alignment pitch.

The average outer diameter l of the coil shape (may also be simply referred to as the "outer diameter of the coil shape"), which is not particularly limited, is typically 50 μm or greater, preferably 75 μm or greater, more preferably 100 μm or greater, and still more preferably 125 μm or greater, and is typically 500 μm or less, preferably 400 μm or less, more preferably 350 μm or less, still more preferably 300 μm or less, particularly preferably 250 μm or less, and most preferably 200 μm or less, for the sake of guaranteeing sufficient electromagnetic wave shielding property. A larger average outer diameter results in a smaller frequency band of electromagnetic waves that can be effectively shielded.

The average winding pitch width m of the coil shape (may also be simply referred to as the "winding pitch width of the coil shape"), which is not particularly limited, is typically greater than 20 μm (exceeds 20 μm), preferably 25 μm or greater, more preferably 30 μm or greater, and still more preferably 35 μm or greater, and is typically 200 μm or less, preferably 150 μm or less, more preferably 100 μm or less, and still more preferably 70 μm or less, for the sake of guaranteeing sufficient electromagnetic wave shielding property. A larger average winding pitch results in a smaller frequency band of electromagnetic waves that can be effectively shielded.

The average length n of the coil-shaped portion of the coil shape in the center axis direction (also referred to simply as the "length of the coil-shaped portion of the coil shape in the center axis direction") is typically 20 μm or greater, preferably 35 μm or greater, more preferably 50 μm or greater, and even more preferably 100 μm or greater, and even more preferably 300 μm or greater, and most preferably 500 μm or greater, and is typically 10000 μm or less, preferably 5000 μm or less, more preferably 3000 μm or less, and even more preferably 1500 μm or less, for the sake of guaranteeing sufficient electromagnetic wave shielding property. Even when the average length of the coil-shaped portion changes, the frequency band of the electromagnetic waves that can be effectively shielded does not change. Higher electromagnetic wave shielding performance can be achieved with a longer length of the coil-shaped portion of the coil shape in the center axis direction.

The average coil alignment pitch o (also simply referred to as "coil alignment pitch"), which is not particularly limited, is typically 150 μm or greater, preferably 200 μm or greater, more preferably 300 μm or greater, and even more preferably 400 μm or greater, for the sake of guaranteeing sufficient electromagnetic wave shielding property. A smaller average coil alignment pitch within this range results in a smaller frequency band of electromagnetic waves that can be effectively shielded. The coil alignment pitch is typically 3000 μm or less, preferably 2000 μm or less, more preferably 1000 μm or less, and even more preferably 750 μm or less. A larger average coil alignment pitch within this range results in a smaller frequency band of electromagnetic waves that can be effectively shielded.

The average wire diameter p of the coil shape (may also be simply referred to as the "wire diameter of the coil shape"), which is not particularly limited, is typically greater than 1 μm (exceeds 1 μm), preferably 5 μm or greater, more preferably 10 μm or greater, and still more preferably 15 μm or greater, and is typically 75 μm or less, preferably 50 μm or less, more preferably 40 μm or less, and still more preferably 30 μm or less, for the sake of guaranteeing sufficient electromagnetic wave shielding property. A larger average wire diameter results in a larger frequency band of electromagnetic waves that can be effectively shielded.

The average winding number of the coil shape of the conductive member (may also be simply referred to as "winding number"), which is not particularly limited, is typically 5 or greater, preferably 7 or greater, more preferably 10 or greater, and still more preferably 14 or greater, and is typically 50 or less, preferably 40 μm or less, more preferably 33 μm or less, and still more preferably 29 μm or less, for the sake of guaranteeing sufficient electromagnetic wave shielding property.

(Characteristics of Conductive Member)
Volume Resistivity

The volume resistivity of the conductive member is not particularly limited. It may be any value approximately sufficient for making a minute current flow. Through study, the present inventors have found that the oscillation frequency is approximately the same between copper with a volume resistivity of 1.55 μΩ cm (0° C.) and tungsten with a volume resistivity of 4.9 μΩ cm (0° C.). An example of the value approximately sufficient for making a minute current flow described above includes a volume resistivity of 3352.8 μΩ cm (20° C.) in a case where carbon (graphite) is used.

Thermal Conductivity

The thermal conductivity of the conductive member is not particularly limited. Through study, the present inventors have found that the oscillation frequency is approximately the same between copper with a thermal conductivity of 394 W/m K and tungsten with a thermal conductivity of 174.3 W/m K.

[Resin]
(Configuration of Resin)

The type of resin is not particularly limited as long as the conductive members described above can be contained. Thus, the resin may be thermosetting resin or thermoplastic resin. Preferably, thermosetting resin is used because the electromagnetic wave shielding sheet can have high temperature depending on its use. Examples of the thermosetting resin include thermosetting resin and photocurable resin. The thermosetting resin include thermosetting acrylic resin, unsaturated polyester resin, epoxy resin, melamine resin, phenol resin, silicone resin, polyimide resin, urethane resin. The photocurable resin includes photocurable epoxy resin, photocurable polyester, photocurable vinyl compound, photocurable epoxy (meth)acrylate, photocurable urethane (meth)acrylate. Among these, unsaturated polyester resin, photocurable polyester, epoxy resin, or photocurable epoxy resin is preferable, and particularly, for the sake of heat resistance, epoxy resin, or photocurable epoxy resin is preferable. One of these types of resin may be used, or any two or more of these types of resin may be used in combination of any ratio.

The content of the resin in the sheet, which is not particularly limited, is typically 60 wt. % or greater, more preferably 80 wt. % or greater, more preferably 90 wt. % or greater, even more preferably 95 wt. % or greater, and even more preferably 97 wt. % or greater, and is typically 99.99 wt. % or less, preferably 99.90 wt. % or less, more preferably 99.5 wt. % or less, and even more preferably 99.0 wt. % or less, for the sake of guaranteeing sufficient electromagnetic wave shielding property.

The conductive member may be completely buried in the resin, or may not be completely buried in the resin (only partially buried), that is, part of the conductive member may be exposed to the outside air. For example, in Example 1 described below and the like, an object obtained by preparing the sheet with the conductive member completely buried in the resin, and then grinding the surface of the sheet to expose part of the conductive material.

(Characteristics of Resin)
Refractive Index

The refractive index of the resin, which is not particularly limited, is typically 1.35 or greater and 1.76 or less, and is preferably 1.55 or greater and 1.61 or less achieved by epoxy resin, for the sake of higher electromagnetic wave shielding property. The refractive index can be measured using a known method.

[Sheet]
(Configuration of Sheet)

The shape of the electromagnetic wave shielding sheet is not particularly limited as long as it is a sheet shape, and can be changed as appropriate depending on where the sheet is disposed. The sheet may be a single layer sheet, or may be a laminated sheet. In a case of the laminated sheet, a plurality of the sheets of the present embodiment may be laminated in one mode, and other sheets may be laminated to provide various functions in another mode.

The thickness of the sheet, which is not particularly limited, is typically 10 μm or greater, preferably 20 μm or greater, even more preferably 50 μm or greater, still more preferably 100 μm or greater, and is typically 10 mm or less, preferably 5 mm or less, more preferably 3 mm or less, and even more preferably 1.5 mm or less, for reducing the size, weight, and thickness of modern electronic devices represented by cell phones, smartphones, tablets, or the like.

The shape of the sheet is flat, but may have unevenness as long as the sheet can be regarded as being approximately flat, and may be partially curved. Furthermore, the shape of the sheet may be a circular shape, or a polygonal shape such as a triangle or a rectangle.

The number of conductive members in the sheet, which is not particularly limited, is typically 5 members/cm$^2$ or greater, preferably 10 members/cm$^2$ or greater, more preferably 25 members/cm$^2$ or greater, even more preferably 100 members/cm$^2$ or greater, and is typically 570 members/cm$^2$ or less, preferably 400 members/cm$^2$ or less, more preferably 300 members/cm$^2$ or less, and even more preferably and 210 members/cm$^2$ or less, for the sake of guaranteeing sufficient electromagnetic wave shielding property.

The number of conductive members described above can be measured by internal observation using CT-X rays.

The mode of how the conductive members are contained in the sheet is not particularly limited. Any number of conductive members may be disposed at any positions. Alternatively, a plurality of conductive members may be arranged at an equal interval in the sheet surface direction in one mode.

The sheet may include a material (other material) other than the conductive member and the resin described above, such as inorganic filler other than the conductive member, for example. For example, the coefficient of linear expansion of the sheet can be adjusted by the addition of the inorganic filler, which makes it easy to prevent the sheet from having warpage, deflection, waviness, and the like.

The content of the inorganic filler other than the conductive member in the sheet is not particularly limited, and may be set to any content as long as the effects of the present embodiment can be achieved.

(Characteristics of Sheet)
Electromagnetic Wave Shielding Property

In the present disclosure, the electromagnetic wave shielding property is evaluated by evaluating power transmittance T(ω) through the method described below. The evaluation method is a method based on terahertz time domain spectroscopy used in a transmittance measurement experiment.

Figure 4:
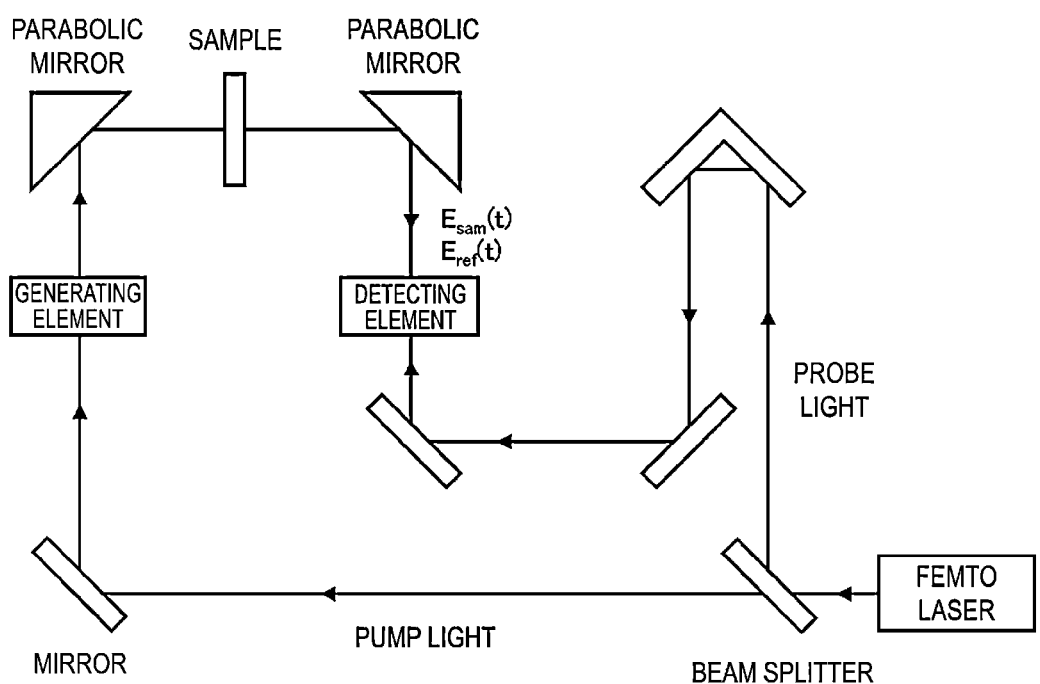
FIG. 4 is a diagram schematically illustrating an experimental apparatus for evaluating electromagnetic wave shielding properties.

FIG. 4 is a schematic view of an experimental apparatus. First, light from a femtosecond laser is divided into pump light and probe light by a beam splitter. The pump light functions as light that excites terahertz waves. The probe light is for adjusting the timing of measuring the terahertz waves. The detection timing is shifted by changing the optical path length of the probe light through movement of a delay stage. An electric field $E_{sam}(t)$ after the terahertz waves have passed through the sample and an electric field $E_{ref}(t)$ after the terahertz waves have passed through the air without the sample are detected. Using these values, a complex refractive index, a complex permittivity, transmittance, power spectrum, and the like are obtained.

Using the data obtained from the measurement described above, the transmittance is obtained through Fourier transform. The Fourier transform is performed on the obtained electric field waveforms $E_{sam}(t)$ and $E_{ref}(t)$, and $E_{sam}(\omega)$ and $E_{ref}(\omega)$ are obtained respectively. Formula (A) below expresses the power transmittance T(ω).

[Math. 1]

$$T(\omega) = \frac{|E_{sam}(\omega)|^2}{|E_{ref}(\omega)|^2} \tag{A}$$

The transmittance described above can be measured by a terahertz spectroscopy system (TAS 7500 TSH manufactured by Advantest Corporation, for example).

From the power transmittance T(ω) described above, shielding performance L (dB) can be obtained using Formula (B) below.

$$L = 10 \times \text{Log}_{10}(T(\omega)/100) \tag{B}$$

The shielding performance L, which is not particularly limited, is typically −2 dB or less, preferably −5 dB or less, and more preferably −10 dB or less. For preventing the malfunctioning of electronic devices such as computers, the shielding performance L is preferably −20 dB or less, more preferably −30 dB or less, even more preferably −40 dB or less, particularly preferably −60 dB or less, and more particularly preferably −80 dB or less. The lower limit of the shielding performance L, which is not necessarily set, is typically −90 dB or greater. The power transmittance T(ω) of the electromagnetic waves is expressed as −20 dB (shield ratio: 90%) when the electromagnetic waves are reduced to 1/10, is expressed as −40 dB (shield ratio: 99%) when the electromagnetic waves are reduced to 1/100, is expressed as −60 dB (shield ratio: 99.9%) when the electromagnetic waves are reduced to 1/1000, and is expressed as −80 dB (shield ratio: 99.99%) when the electromagnetic waves are reduced to 1/10000.

<Method for Manufacturing Resin Molded Body>

Embodiments related to a method for manufacturing various resin molded bodies will be described below. Note that the method for manufacturing the resin molded body described above is not limited to these manufacturing methods. Manufacturing conditions applicable to various other embodiments can be applied to these embodiments. The condition for the resin molded body described above can be applied to the conditions of the manufacturing methods described below, within a range of applicability.

<First Manufacturing Method>

A first method for manufacturing an electromagnetic wave shield that is another embodiment of the present disclosure (also simply referred to as "first manufacturing method" in the description of the present embodiment) is a method for manufacturing a resin molded body that includes resin and a conductive member having a coil shape with a center axis, with a flat surface in at least part of the resin molded body, the method including:

preparing a resin member including a flat surface in at least part thereof, the resin member including a pocket;

arranging the conductive member oriented, in the pocket; and pouring a composition including resin into the pocket in which the conductive member is arranged, and then curing the composition, in which an average angle between the flat surface and the center axis is 50° or greater.

As described above in the above description on the resin molded body, the resin molded body preferably has a sheet shape. In such a case, the method can be expressed as a method for manufacturing a resin molded body that includes resin and a conductive member having a coil shape with a center axis, the method including:

preparing a resin sheet, the resin sheet including a pocket;

arranging the conductive member oriented, in the pocket; and pouring a composition including resin into the pocket in which the conductive member is arranged, and then curing the composition, in which an average angle between the flat surface of the sheet and the center axis is 50° or greater.

The first manufacturing method including the preparing of the resin sheet, the arranging of the conductive member, and the pouring and curing of the composition described above may further include other steps. An example of the first manufacturing method including such other steps will be described below.

[Preparing of Resin Composition]

The first manufacturing method may include preparing a resin composition by dissolving and mixing the above-described resin or other materials in a solvent. The method for the mixing is not particularly limited, and a known method can be used.

The type of solvent is not particularly limited as long as the above-described resin and other materials can be dissolved in it. If the resin composition can be molded without using the solvent, the solvent may not be used.

A curing agent may be added depending on the type of resin used. The curing agent of a known type may be used as appropriate depending on the resin. The content of the curing agent in the composition can be, for example, 0.05 to 15 wt. %.

Depending on the type of resin used, a polymerization initiator can be added. For example, as a thermal polymerization initiator, a thermal radical generator such as a peroxide such as benzoyl peroxide can be used. As a photopolymerization initiator, a photoradical generator, a photocation generator, a photoanion generator, or the like can be used.

[Preparing of Resin Sheet]

The first manufacturing method includes preparing a resin member including a pocket (in particular, a resin sheet including a pocket) and a flat surface in at least part thereof. A method for preparing the resin member including a pocket and a flat surface in at least part thereof is not particularly limited, and includes, for example, a molding method for pouring, into a mold with which the pocket can be formed, the resin composition obtained in the preparing of the resin composition described above, and curing the resin composition using heat, light such as ultraviolet ray. The method for production further includes a method for curing the resin composition described above using a known method to mold a resin member including a flat surface in at least part thereof, the resin member not including a pocket, and then performing laser processing to form the pocket. The molding may be performed with or without pressure applied. When the pressure is applied, for example, press molding can be used.

The size of the pocket has a large impact on an angle formed between the center axis of the conductive member and a direction of the flat surface that at least part of the resin member has (sheet flat surface direction when the resin molded body has a sheet shape). Thus, the size of the pocket is set in accordance with the mode of use of the member finally obtained. For example, when the angle formed between the center axis of the conductive member and the direction of the flat surface that at least part of the resin member has is to be approximately 90°, it suffices if the size of the pocket and the size of the conductive member (the shape of the cross section in a direction perpendicular to the center axis) are set to be substantially the same.

The pocket may or may not be formed through the member.

Parameters such as the number of pockets and the thickness of the member may be set as appropriate based on the description of the parameters of the configuration of the resin molded body described above.

[Arranging of Conductive Member]

Figure 5:
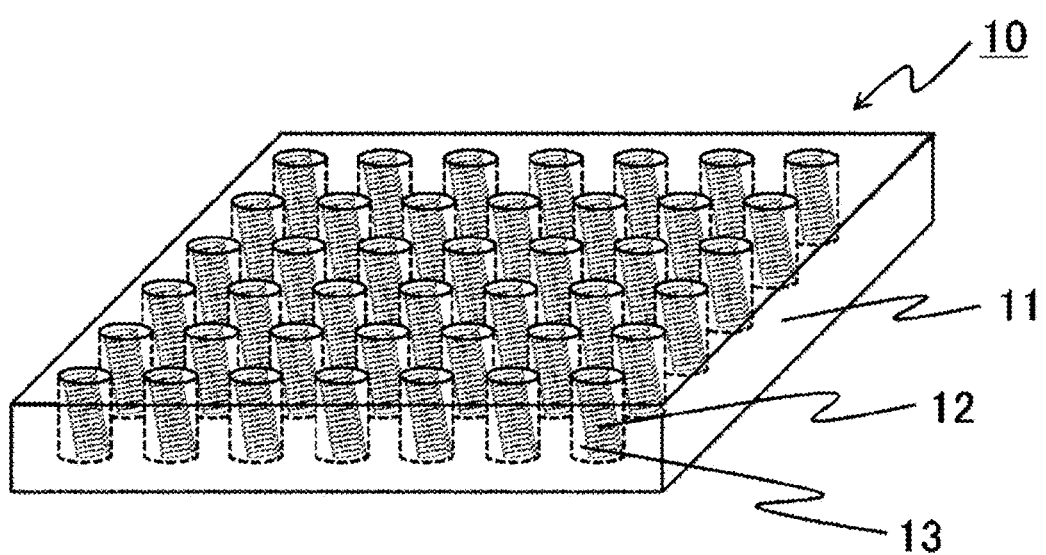
FIG. 5 is a diagram schematically illustrating a mode of a member having a pocket in which a conductive member is disposed.
Figure 10:
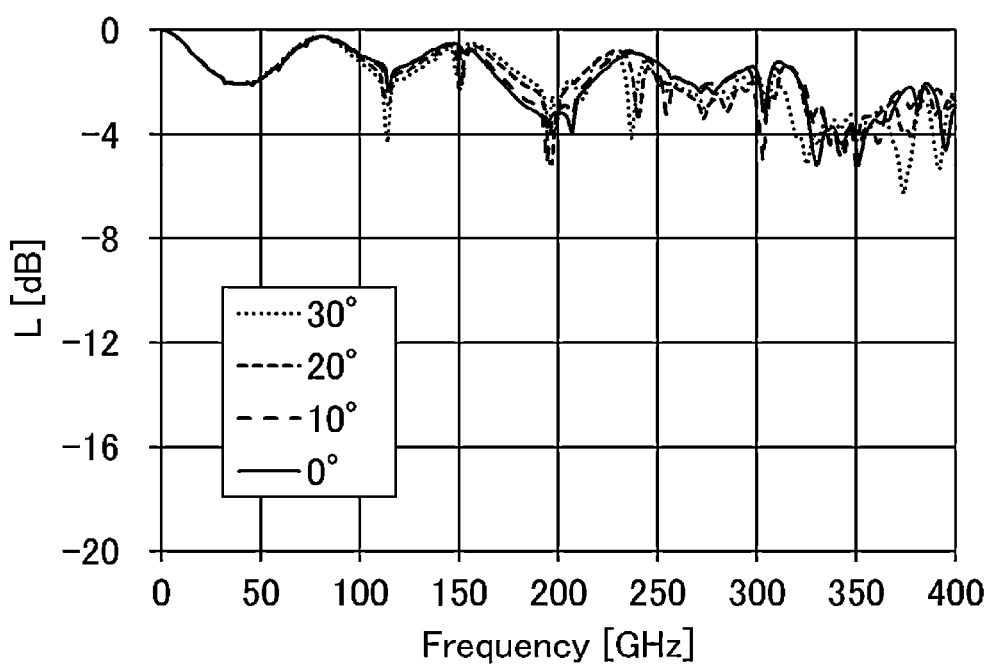
FIG. 10 is a diagram showing a result (θ=0 to 30°) of the simulation of experiment A1 (x-axis inclination experiment) of Example.
Figure 11:
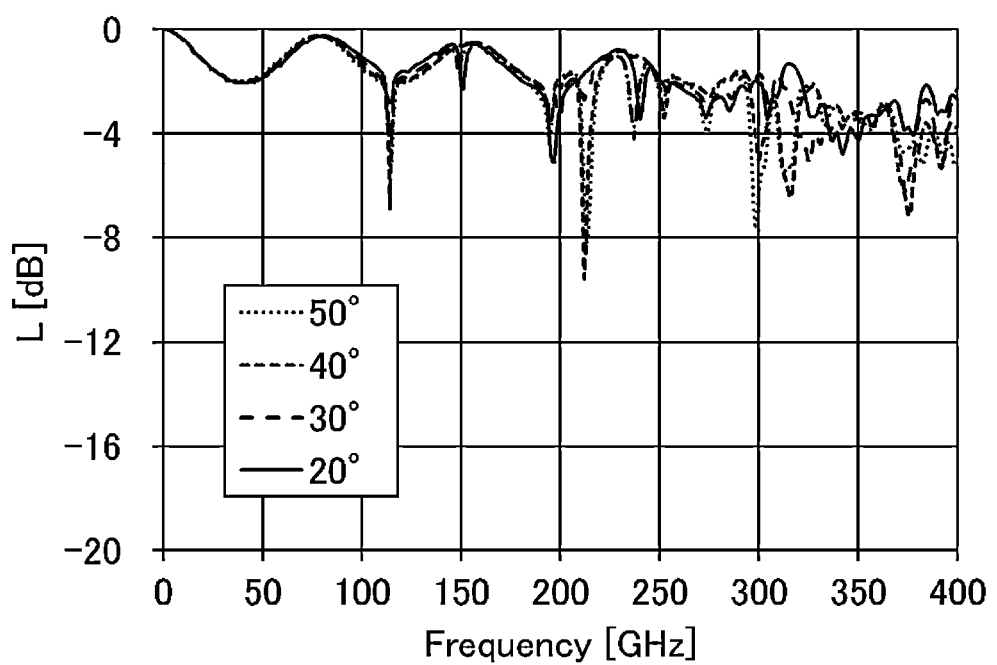
FIG. 11 is a diagram showing a result (θ=20 to 50°) of the simulation of experiment A1 (x-axis inclination experiment) of Example.
Figure 12:
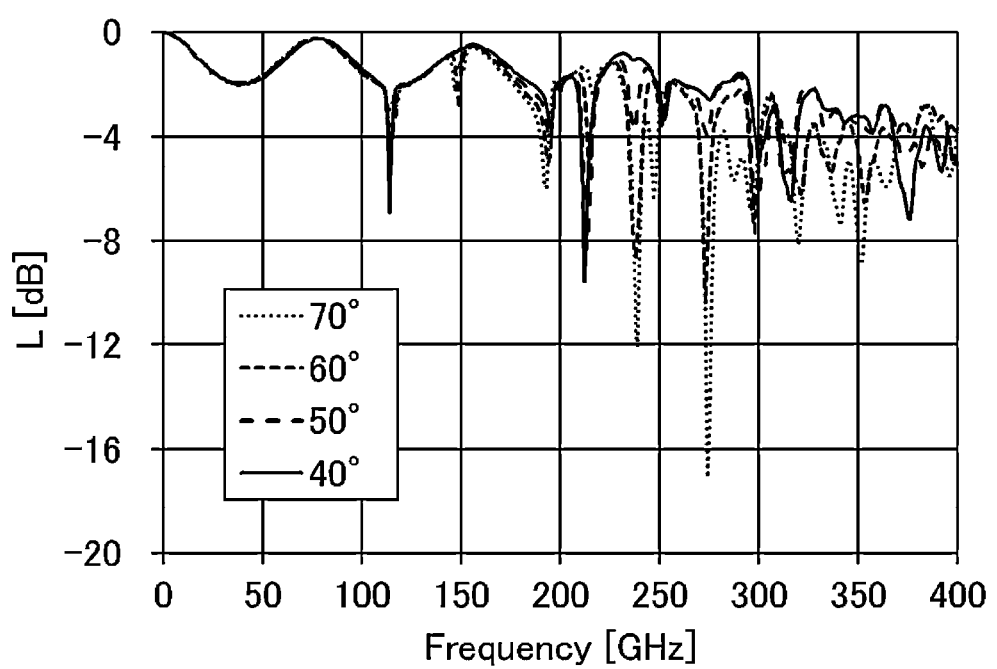
FIG. 12 is a diagram showing a result (θ=40 to 70°) of the simulation of experiment A1 (x-axis inclination experiment) of Example.
Figure 13:
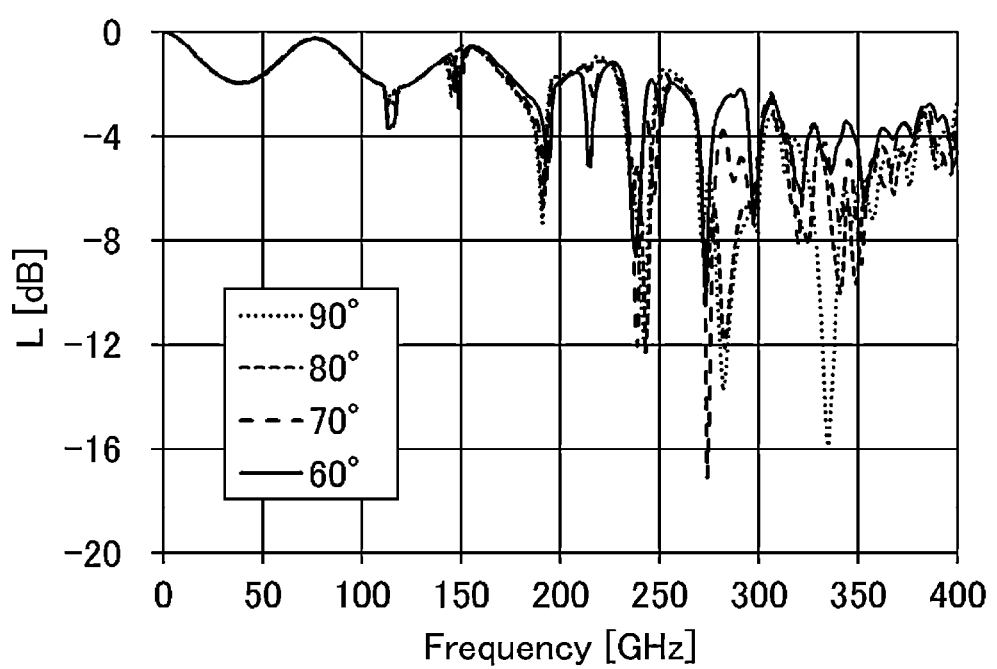
FIG. 13 is a diagram showing a result (θ=60 to 90°) of the simulation of experiment A1 (x-axis inclination experiment) of Example.

The first manufacturing method includes arranging the conductive member oriented, in the pocket of the member obtained by the preparing of the resin sheet described above. As illustrated in FIG. 5, a method for orienting the conductive member includes a method for arranging a conductive member 12 to be at a desired angle with respect to a pocket 13 of a pocket resin member (resin sheet in the FIG. 10 including a cured object 11 of the resin composition (also simply referred to as "resin 11"). In this process, when the pocket is formed through the member, an adhesive sheet may be arranged below the member, and the conductive member may be oriented by being adhered to the adhesive sheet to be held at the desired angle in the pocket. The adhesive member may be removed from the resin member after the pouring and curing of the composition described below.

With the orienting described above, the conductive member is arranged with the average angle between the center axis and the flat surface that at least part of the resin member has is 50° or greater.

[Pouring and Curing of Composition]

The first manufacturing method includes pouring, into the pocket in which the conductive member is arranged in the arranging of the conductive member described above, a composition including resin, and then curing the composition. The composition including the resin poured is preferably the resin prepared in the preparing of the resin composition described above.

A method for curing the composition is not particularly limited, and can be changed as appropriate depending on the type of resin. An example of the method includes a method for curing using heat, light such as ultraviolet ray. When a thermoplastic resin is used, and the composition described above is prepared in a molten state achieved with heat applied, the curing may be performed by leaving it to stand still or through processing such as cooling processing.

<Second Manufacturing Method>

A second method for manufacturing a resin molded body that is another embodiment of the present disclosure (also simply referred to as "second manufacturing method" in the description of the present embodiment) is a method for manufacturing a resin molded body that includes resin and a conductive member having a coil shape with a center axis, with a flat surface in at least part of the resin molded body, the method including:

preparing a plurality of resin sheets each including the resin, a C-shaped conductive material, and a column-shaped conductive material connected to an end portion of the; and layering the plurality of resin sheets, with the end portion of the C-shaped conductive material in one of the sheets being in contact with the column-shaped conductive material in another one of the sheets in a direction of the center axis.

As described above in the above description on the resin molded body, the resin molded body preferably has a sheet shape. In such a case, the method can be expressed as a method for manufacturing a resin molded body that includes resin and a conductive member having a coil shape with a center axis, the method including:

preparing a plurality of resin sheets each including the resin, a C-shaped conductive material, and a column-shaped conductive material connected to an end portion of the C-shaped conductive material; and layering the plurality of resin sheets, with the end portion of the C-shaped conductive material in one of the sheets being in contact with the column-shaped conductive material in another one of the sheets in a direction of the center axis.

The second manufacturing method including the preparing of the resin sheets including the C-shaped conductive material and the layering described above may further include other steps. An example of the second manufacturing method including such other steps will be described below.

[Preparing of Resin Composition]

The second manufacturing method may include preparing a resin composition by dissolving and mixing the above-described resin or other materials in a solvent. For the step, the conditions of the preparing of the resin composition in the first manufacturing method described above may be similarly applied.

Figure 6:
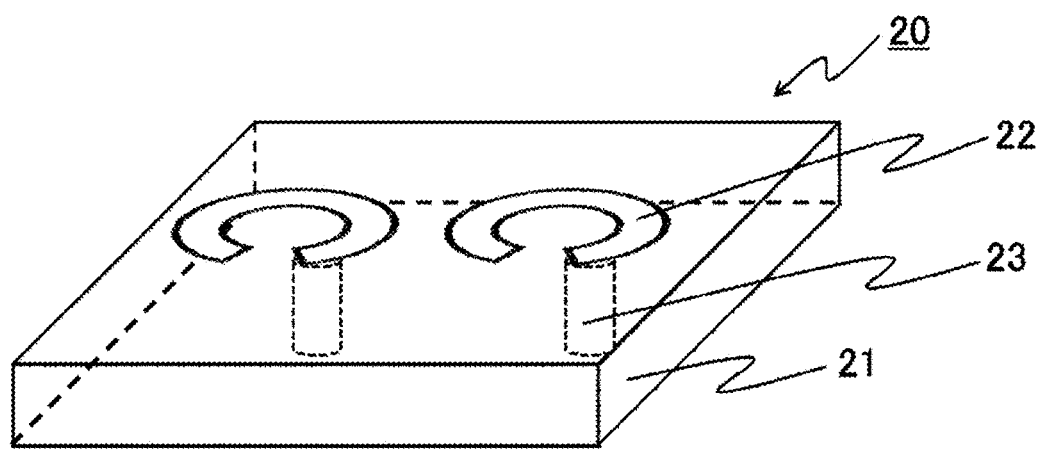
FIG. 6 is a diagram schematically illustrating a mode of a resin sheet having a C-shaped conductive material and a column-shaped conductive material connected to an end portion of the C-shaped conductive material.

Preparing of Resin Sheets including C-shaped Conductive Material The second manufacturing method includes preparing a plurality of resin sheets each including resin, a C-shaped conductive material, and a column-shaped conductive material connected to an end portion of the C-shaped conductive material. The method for preparing such resin sheets is not particularly limited, and includes, for example, a method including: preparing a mold in which the C-shaped conductive material and the column-shaped conductive material are arranged; pouring the resin composition obtained in the preparing of the resin composition described above into the mold; and curing the resin to obtain a resin sheet including a C-shaped conductive material 20 including a resin composition cured object 21 (also simply referred to as "resin 21"), a C-shaped conductive material 22, and a column-shaped conductive material 23 as illustrated in FIG. 6. An example of the method for curing the resin includes a method using heat, light such as ultraviolet ray.

Furthermore, a method used in manufacturing of a typical printed wiring board may be used. Specifically, after the resin sheet has been prepared by curing the above-described resin composition, a hole (via) is formed using a drill, laser, or the like at a portion where the column-shaped conductive material is disposed, conductive material foil is formed on one side of the sheet, a photosensitive resist is coated or laminated in a pattern with which the conductive material foil of a C shape remains after the etching, and then the etching is performed. Thus, the C-shaped conductive material is laminated on the resin sheet. A method for layering the C-shaped conductive material on the resin sheet through etching may be performed through a method other than the one using the photosensitive resin described above. Specifically, it may be performed by printing an etching resist pattern. Then, conductive material paste is poured into the hole described above, and then is cured to form the column-shaped conductive material, and thus the resin sheet including the C-shaped conductive material is obtained. When air remains in the column-shaped portion, the volume resistivity increases. In such a case, reflow temperature for mounting a semiconductor part may cause expansion, explosion, and thus breaking. In view of this, air preferably does not remain in the column-shaped portion.

Parameters of the C-shaped conductive material and the column-shaped conductive material may be set as appropriate based on the description of the parameters of the configuration of the resin molded body described above.

Also in a mode where the C-shaped conductive material described above and the like is used, the condition of the average angle described above is applied for the average angle between the flat surface of the sheet and the center axis.

[Layering]

Figure 7:
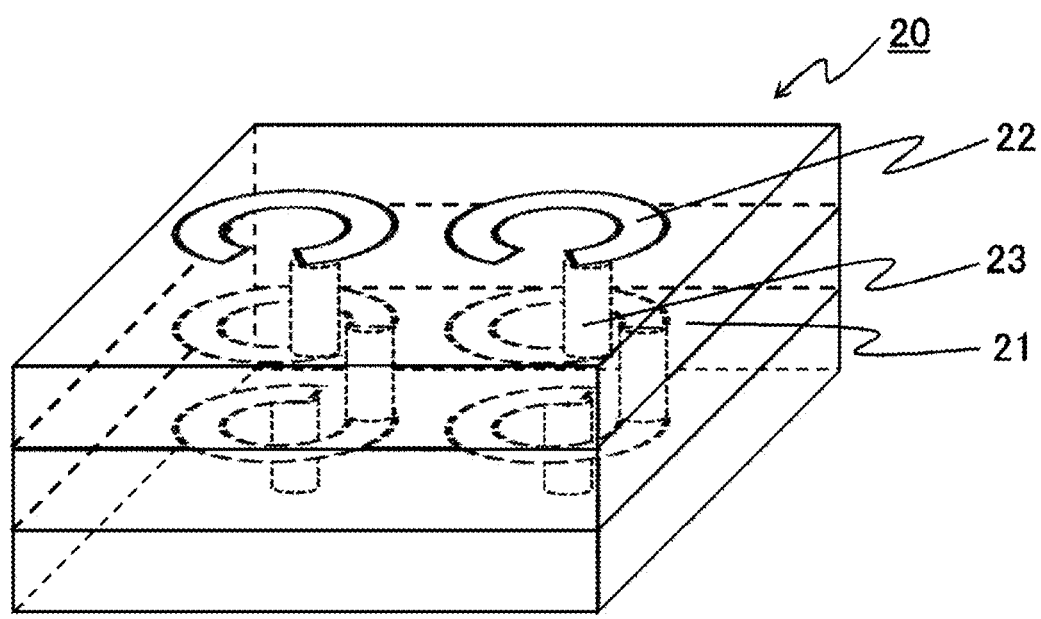
FIG. 7 is a diagram schematically illustrating a mode of a laminated sheet obtained by layering resin sheets each having the C-shaped conductive material and the column-shaped conductive material connected to the end portion of the end portion of the C-shaped conductive material.

The second manufacturing method includes layering the plurality of resin sheets, with the end portion of the C-shaped conductive material in one of the sheets prepared in the preparing of resin sheets described above being in contact with the column-shaped conductive material in another one of the sheets in a direction of the center axis. For example, with the layering method, the sheets are layered with an end portion of the C-shaped conductive material in one of the sheets brought into contact with the column-shaped conductive material in another one of the sheets in the center axis direction as illustrated in FIG. 7.

<Third Manufacturing Method>

A third method for manufacturing an electromagnetic wave shield that is another embodiment of the present disclosure (also simply referred to as "third manufacturing method" in the description of the present embodiment) is a method for manufacturing a resin molded body that includes resin and a conductive member having a coil shape with a center axis, with a flat surface in at least part of the resin molded body, the method including:

preparing a composition including a resin composition including the resin and the conductive member;

orienting the conductive member to achieve an angle of 50° or greater between the flat surface direction (a sheet flat surface direction when the resin molded body has a sheet shape) and the center axis; and curing the resin composition including the conductive member while holding the orientation of the conductive member.

As described above in the above description on the resin molded body, the resin molded body preferably has a sheet shape. In such a case, the method can be expressed as a method for manufacturing a resin molded body that includes resin and a conductive member having a coil shape with a center axis, the method including:

preparing a composition including a resin composition including the resin and the conductive member;

orienting the conductive member to achieve an average angle of 50° or greater between a flat surface direction of the sheet and the center axis; and curing the resin composition including the conductive member while holding the orientation of the conductive member.

The third manufacturing method including the preparing and curing of the composition, the orienting of the conductive member, and the curing of the resin composition described above may further include other steps. An example of the third manufacturing method including such other steps will be described below.

[Plating of Surface of Conductive Member]

One method for orienting the conductive member described below is a method for orienting the conductive member while applying a magnetic field thereto. To perform the orientation through such a method, the conductive member needs to be magnetic. Thus, the third manufacturing method may include plating the surface of the conductive member with a magnetic material. The magnetic material may be iron, cobalt, nickel, or gadolinium. The method for the plating is not particularly limited, and a known method can be used.

The thickness of the plating can be set as appropriate within a range in which the effects of the present invention can be achieved. For example, the thickness may be, for example, 1 μm or greater and 10 μm or less, 1 μm or greater and 8 μm or less, 1 μm or greater and 5 μm or less, 1 μm or greater and 5 μm or less, and 2 μm or greater and 4 μm or less.

When the conductive member includes a magnetic material in the first place, the conductive member can be oriented by application of the magnetic field, without the plating of the surface of the conductive member described above.

[Preparing of Composition]

The third manufacturing method includes preparing a composition including a resin composition including resin and a conductive member. When the magnetic field is used in the orientation in the orienting of the conductive member described below, the conductive member obtained by the plating of the surface of the conductive member described above may be used as the conductive member. The method for manufacturing the composition is not particularly limited, and may be a method for adding the resin, conductive material, and other materials described above together in a solvent, and mixing them. The method for the mixing is not particularly limited, and a known method can be used.

Regarding whether to use the solvent as well as the type and the content of the solvent, the conditions of the preparing of the resin composition in the first manufacturing method described above may be similarly applied.

[Orienting of Conductive Member]

The third manufacturing method includes orienting the conductive member to achieve an average angle of 50° or greater between the above-described flat surface direction (sheet flat surface direction when the resin molded body has a sheet shape) and the center axis. The method for orienting the conductive member is not particularly limited. When the conductive member includes a magnetic material for example, or when the conductive member is provided with magnetism in the plating of the surface of the conductive member described above, the conductive member can be oriented by applying a magnetic field. The method generating the magnetic field is not particularly limited, and a known method can be used. By controlling the direction and intensity of the magnetic field, the conductive member can be oriented at a desired angle.

[Curing Step]

The third manufacturing method includes curing the resin composition including the conductive member while holding the orientation of the conductive member. An example of the method for curing is not particularly limited, and includes a method using heat, light such as ultraviolet ray.

<Other Manufacturing Methods>

An example of a method other than the first to the third manufacturing methods described above includes a method for manufacturing a resin molded body that includes resin and a conductive member having a coil shape with a center axis, with a flat surface in at least part of the resin molded body, the method including:

orienting the conductive member to achieve an angle of 50° or greater between the flat surface direction (sheet flat surface direction when the resin molded body has a sheet shape) and the center axis;

pouring a resin composition including the resin, while holding the orientation of the conductive member; and curing the resin composition while holding the orientation of the conductive member.

As described above in the above description on the resin molded body, the resin molded body preferably has a sheet shape. In such a case, the method can be expressed as a method for manufacturing a resin molded body that includes resin and a conductive member having a coil shape with a center axis, the method including:

orienting the conductive member to achieve an angle of 50° or greater between a flat surface direction of the sheet and the center axis;

pouring a resin composition including the resin, while holding the orientation of the conductive member; and curing the resin composition while holding the orientation of the conductive member.

The method for orientation in the orienting of the conductive member described above is not particularly limited. An example of such a method includes a method including: preparing an adhesive sheet; and attaching the conductive member described above on the adhesive sheet at a predetermined angle.

The method for pouring in the pouring of the resin composition described above is not particularly limited. Preferably, the pouring is performed at a desired poring rate, and thus the orientation of the conductive member can be held.

The method for curing in the curing of the resin composition described above is not particularly limited, and includes a method for curing through processing using heat, light, if the target is thermosetting resin.

Figure 8:
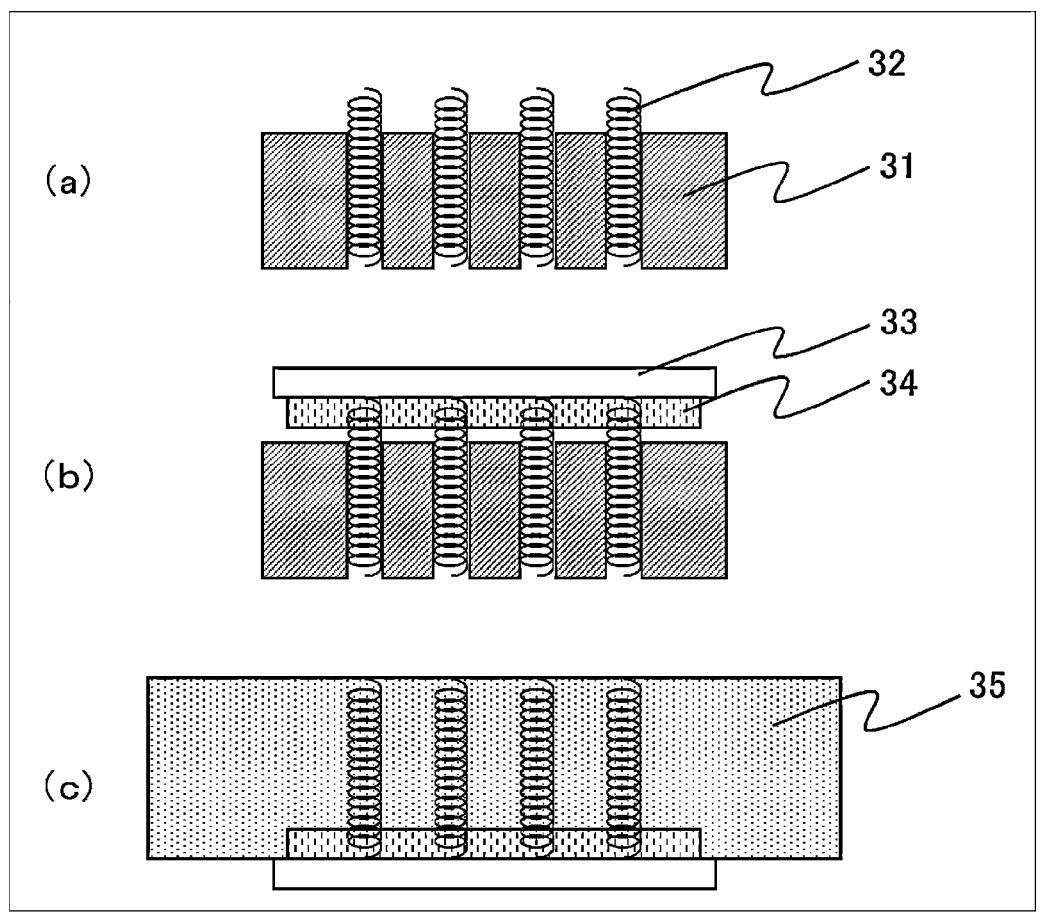
FIG. 8 is a diagram schematically illustrating a mode of a method for manufacturing a resin molded body.

Another method for orientation in the orienting of the conductive member includes a method for placing conductive members 32 side by side using a support body A31, as illustrated in FIG. 8, (a). The material of the support body A31 is not particularly limited, and may be a conductive material, inorganic material, organic material, or the like.

Then, for example, a support body B33 coated with a resin composition S is brought into contact with end portions of all the coils, and then the resin composition S is cured. Thus, the conductive members 32 are fixed by a cured object 34 of the resin composition S as illustrated in FIG. 8, (b). Then, the conductive members 32 are pulled out from the support body A31, and a resin composition T including resin is poured while the orientation of the conductive members 32 is held (pouring of the resin composition). Then, the resin composition T is cured (curing of the resin composition). As a result, the resin molded body including a cured object 35 of the resin composition T and the conductive members 32 is obtained as illustrated in FIG. 8, (c). The support body B33 described above may be ultimately removed.

The resin composition S for fixing the end portions of all the coils and the resin composition T poured in the pouring of the resin composition as described above may be the same material or different materials. Preferably, they are the same material for the sake of property stability.

<Second Resin Molded Body>

A second resin molded body is described below in detail.

<Configuration and Characteristics of Electromagnetic Wave Shielding Sheet>

The second resin molded body that is an embodiment of the present disclosure (also simply referred to as "resin molded body") is a resin molded body that includes resin and a conductive coil (also simply referred to as "coil"), with the conductive member forming the conductive coil having a spiral shape. The expression "the conductive member forming the conductive coil having a spiral shape" can also be expressed as the conductive coil having a spiral shape being further formed into a spiral shape, the center axis of the conductive coil having a spiral shape being formed into a spiral shape, or a wire forming the conductive coil having a spiral shape.

The present inventors have focused on a coil shape with a center axis as a structure with which strong electromagnetic waves in a terahertz range can be absorbed. With a material with the coil shape, polarized light can be controlled. When the incident electromagnetic waves that are linearly polarized light enter the material with the coil shape, the polarized light is converted into an elliptically polarized light to be emitted. Thus, the material with the coil shape can be used for controlling the polarized light. In the present embodiment, the magnitude of electromagnetic wave absorption by the coil shape is focused instead of the control of the polarized light.

Furthermore, the present inventors have focused on the fact that one winding of the coil shape described above can be regarded as an LC resonance circuit. In this case, considering the transmittance of the material with the coil shape, the electromagnetic wave absorption effect through LC resonance can be achieved with C being the capacitance of a gap in the coil shape and L being the inductance of the coil shape itself. Thus, increase in the winding number of the coil shape is expected to lead to improvement in the electromagnetic wave absorption effect.

The electromagnetic wave absorption effect through the LC resonance described above also has a huge impact on the angle between the center axis of the coil shape and the electromagnetic waves. Specifically, when the angle is 90°, the electromagnetic wave absorption effect is small. On the other hand, when the angle is 0°, the electromagnetic wave absorption effect is large.

The present inventors have focused on the point described above, and found that a member (sheet member in particular) having excellent electromagnetic wave shielding property can be prepared by using the conductive coil as a coil-shaped conductive filler included in the resin, with the conductive member forming the conductive coil having a spiral shape, and thus completed the present invention.

The shape of the resin molded body is not particularly limited as long as at least part of which has a flat surface. The position of the flat surface is not particularly limited. Still, the resin molded body is preferably formed with the normal direction of the flat surface matching the incident direction of external electromagnetic waves. When the resin molded body is mounted on another member to be used, the resin molded body is preferably formed to have the flat surface serving as a surface for the mounting on the other member.

Examples of the specific shape of the resin molded body include a sheet shape, a spherical shape at least part of which has a flat surface, a column shape such as circular column shape or a polygonal column shape at least part of which has a flat surface. Among these, the sheet shape is preferable in terms of handleability.

The applications of the molded body described above are not particularly limited, and include an electromagnetic wave shield, for example.

A mode of the resin molded body having the sheet shape, particularly, a mode of the electromagnetic wave shielding sheet will be described below in detail. The flat surface of the sheet described below corresponds to the flat surface that at least part of the resin molded body in the present embodiment has. The conditions of the following mode are applicable to conditions of a mode other than a sheet shape, without departing from the range of applicability.

In the present embodiment, the conductive coil described above is also referred to as a "double coil", and a typical conductive coil without the above spiral shape is referred to as a "single coil".

Figure 20:
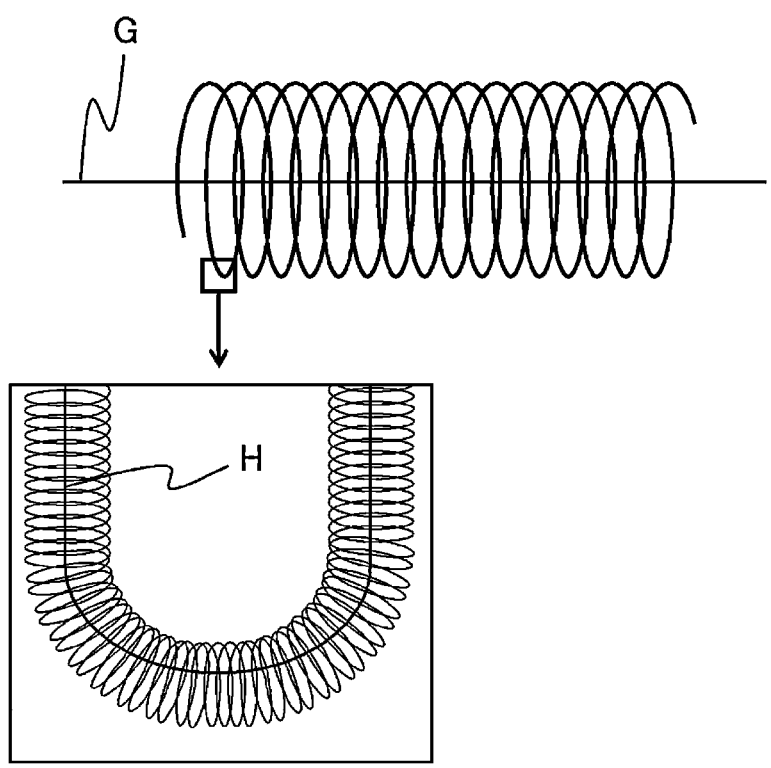
FIG. 20 is a diagram schematically illustrating a mode of a conductive coil.
Figure 21:
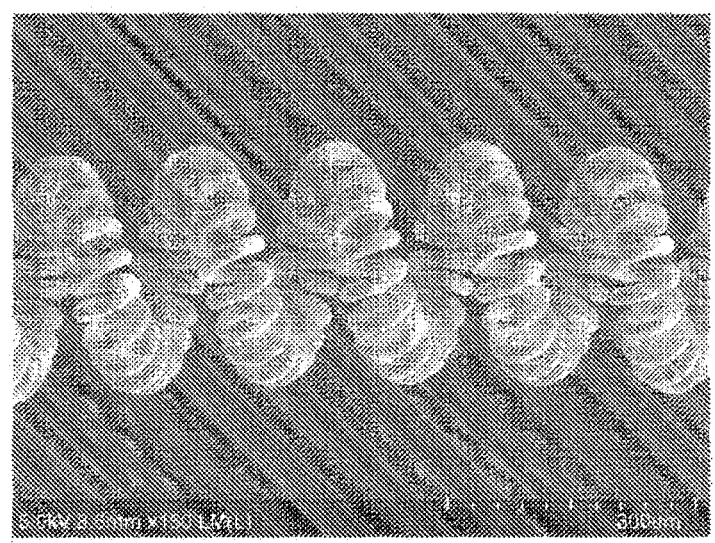
FIG. 21 is a scanning electron microscope image of the conductive coil (photograph used as a drawing).

As illustrated in FIGS. 20 and 21, the double coil described above is formed with the conductive member forming the conductive coil further formed into a spiral shape. FIG. 20 is a diagram schematically illustrating one mode of a coil. FIG. 21 is a scanning electron microscope image of the conductive coil. In the description below, a spiral of the double coil that is similar to that of the single coil is referred to as "large spiral", and a spiral formed in a wire forming the large spiral is referred to as "small spiral". In FIG. 20, G represents the center axis of the large spiral, and H represents the center axis of the small spiral. With the electromagnetic wave shielding sheet according to the present embodiment, the electromagnetic wave absorption effect through the LC resonance of the large spiral is exhibited when the electromagnetic waves pass through the interior of the large spiral. Furthermore, when the electromagnetic waves pass through the interior of the small spiral, the electromagnetic wave absorption effect through the LC resonance of the small spiral is also exhibited. The electromagnetic wave shielding sheet according to the present embodiment uses the coil with such a structure, and thus sufficient shielding property can be guaranteed for electromagnetic waves in a high frequency band.

As will be described in a method for manufacturing a sheet below, an electromagnetic wave shielding sheet including a double coil can be manufactured by preparing a composition including the double coil and the resin, and curing the composition, for example.

In a case where a sheet is manufactured by a method similar to the method for manufacturing the double coil as described above, that is, by the method for curing a composition including a coil and resin, using a generally coil-shaped filler that may be the single coil or the double coil, when the time between the production of the composition and the curing is short, a sheet is obtained in which a plurality of coils are oriented at any inclination. On the other hand, when the time between the production of the composition and the curing is long, a sheet is obtained in which the coils lie, that is, a sheet is obtained having a high percentage of the number of coils in which the angle between the center axis of the large spiral and the sheet flat surface direction of the sheet is close to 0, because the coil has a larger specific gravity than the resin.

Here, in the case where the time between the production of the composition and the curing is short (the case of the sheet in which the plurality of coils are oriented at any inclination), when the single coil is used as the coil, coils can be at any angles by substantially the same possibility, meaning that a large electromagnetic wave shielding effect cannot be obtained. On the other hand, when the double coil is used as the coil, there is no single coil and the center axis itself is in the spiral shape, and thus there is a portion of "small spiral" with which the electromagnetic waves from various directions may be absorbed through the LC resonance, whereby a large electromagnetic wave shielding effect can be attained.

In the case where the time between the production of the composition and the curing is long (when the sheet is obtained having a high percentage of the number of coils in which the angle between the center axis and the sheet flat surface direction is close to 0°), when the single coil is used as the coil, the angle between the center axis of the coil and the direction of the electromagnetic waves is close to 90° (60 to 90°, for example), and thus almost no electromagnetic wave shielding effect is obtained. On the other hand, when the double coil as illustrated in FIG. 21 is used as the coil, the direction of the center axis of the large spiral of the double coil is substantially the same as the sheet direction as in the case of the single coil, whereas the center axis of the small spiral transitions from approximately 0° to approximately 90° then from approximately 90° to approximately 0° relative to the sheet flat surface direction to form a spiral shape (single winding is drawn by transition from approximately 0° to approximately 90° to approximately 0° to approximately 90° and to approximately 0°). Thus, part of the center axis of the small spiral is at an angle close to an angle with which large electromagnetic wave absorption through the LC resonance is achieved, that is, 90° relative to the sheet flat surface. This angle with which large electromagnetic wave absorption through the LC resonance is achieved depends on the winding number of the small spiral. All things considered, when the double coil is used, a large electromagnetic wave shielding effect can be attained even when the time between the production of the composition and the curing is long.

When a typical metal coil is used, the metamaterial structure with which various parameters of the electromagnetic wave shielding property can be improved is preferably formed. The metamaterial structure in the present embodiment is a mode in which the metal coils are arranged in an aligned manner in the resin. More specifically, it implies a mode in which the metal coils are arranged at a periodic interval in the resin. In the case of the single coil, the metamaterial structure is formed only when the single coils are arranged in an aligned manner. On the other hand, in the case of the double coil, the small spirals are naturally arranged in an aligned manner in the double coil. Thus, the double coil itself can be regarded as a matter having a single metamaterial structure. Thus, the double coil can be in any mode to achieve the effects of the metamaterial structure, and is not limited to the mode of being arranged in an aligned manner as in the case of the single coils.

[Conductive Coil]
(Configuration of Conductive Coil)

The conductive coil (double coil) is not particularly limited as long as the conductive member forming the conductive coil has a spiral shape as illustrated in FIGS. 20 and 21. The double coil can be manufactured by a known method, and may be a commercially available product.

The large spiral of the double coil is not limited to one with a linear center axis, and may be one with a center axis that may be approximate to a linear line. When the conductive member has the center axis that may be approximate to a linear line, the center axis is expressed by the approximate linear line.

The cross-sectional shape of the wire forming the spiral shape is not particularly limited, and, for example, may be a circle or a polygonal shape such as a triangle or a rectangle. Preferably, the cross-sectional shape is circular, and thus it can be obtained or manufactured easily.

Figure 22:
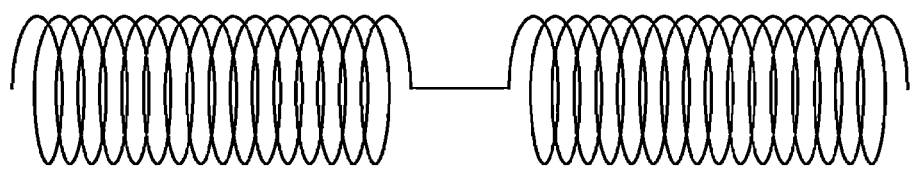
FIG. 22 is a diagram schematically illustrating a mode of a conductive coil.

A plurality of the double coils may be coupled to each other as illustrated in FIG. 22 (where the structure of the small spiral is omitted), or the double coil may not be coupled. When they are coupled, the center axes of their large spiral shapes may not be coaxially arranged. When the center axes of the large spiral shapes are not coaxially arranged, each portion having the spiral shape is regarded as one double coil, and a parameter is calculated for each of the double coils.

The type of material of the double coil is not particularly limited as long as it has conductivity. Examples of the material include a carbon material such as carbon, as well as copper (Cu), aluminum (Al), iron (Fe), gold (Au), silver (Ag), platinum (Pt), magnesium (Mg), zinc (Zn), tungsten (W), titanium (Ti), nickel (Ni), or manganese (Mn), an alloy that is a combination of these metal elements, or an oxide of these metal elements or an alloy of these, a metal-containing compound such as a halide or a sulfide. Preferably copper (Cu) or iron (Fe) is used, and more preferably, tungsten (W) is used, for the sake of durability of the resin sheet since these are elements that have an elastic modulus suitable for coil processing and, when mixed in resin, achieve a high corrosion resistance and a small coefficient of linear expansion.

The content of the double coil in the sheet is not particularly limited. The content per volume of the sheet is typically $0.02$ g/cm$^3$ or greater, preferably $0.05$ g/cm$^3$ or greater, more preferably $0.10$ g/cm$^3$ or greater, further preferably $0.150$ g/cm$^3$ or greater, and particularly preferably $0.20$ g/cm$^3$ or greater, and is typically less than $5.00$ g/cm$^3$, preferably less than $4.50$ g/cm$^3$, more preferably less than $3.00$ g/cm$^3$, further preferably less than $2.00$ g/cm$^3$, and particularly preferably less than $1.50$ g/cm$^3$, for the sake of higher electromagnetic wave shielding property.

In the electromagnetic wave shielding sheet of the present embodiment, the double coil having superior electromagnetic wave shielding property per coil to that of the single coil is used. Thus, the amount of conductive member used in the electromagnetic wave shielding sheet of the present embodiment can be less compared with the electromagnetic wave shielding sheet manufactured using the single coil, when the electromagnetic wave shielding property to be achieved is the same. Typically, the price per volume of the conductive member is higher than that of resin. Thus, the electromagnetic wave shielding sheet of the present embodiment can be obtained with a lower material cost than the electromagnetic wave shielding sheet manufactured using the single coil.

As illustrated in FIG. 2 (the structure of the small spiral is omitted), an angle $\theta$ between the center axis of the large spiral of the double coil and the sheet flat surface is typically 50° or less, preferably 40° or less, more preferably 30° or less, even more preferably 20° or less, particularly preferably 10° or less, more particularly preferably 5° or less, and logically most preferably 0° to guarantee sufficient electromagnetic wave shielding property. The average angle is an average value of angles between the center axes of a large spiral obtained with each of the double coils in the sheet and the flat surface of the sheet. With $\theta$ closer to 0°, the angle between the center axis of the small coil and the sheet flat surface direction is likely to be closer to 90°, and thus larger electromagnetic wave shielding effect is achieved.

The angles described above can be measured by internal observation using CT-X rays.

When a plurality of double coils are used, the double coils need not to be arranged to form the metamaterial structure since the double coils themselves have the metamaterial structure as described above. Still, the double coils are preferably arranged to form the metamaterial structure for the sake of even higher electromagnetic wave shielding property. In a case of the metamaterial structure, the mode of the alignment is not particularly limited, and includes modes in which the conductive members are arranged in an aligned manner to form a circular shape, or a polygonal shape such as a triangular or rectangular shape. The arrangement in an aligned manner may be formed by a single stage or may be formed by two or more stages.

Figure 23:
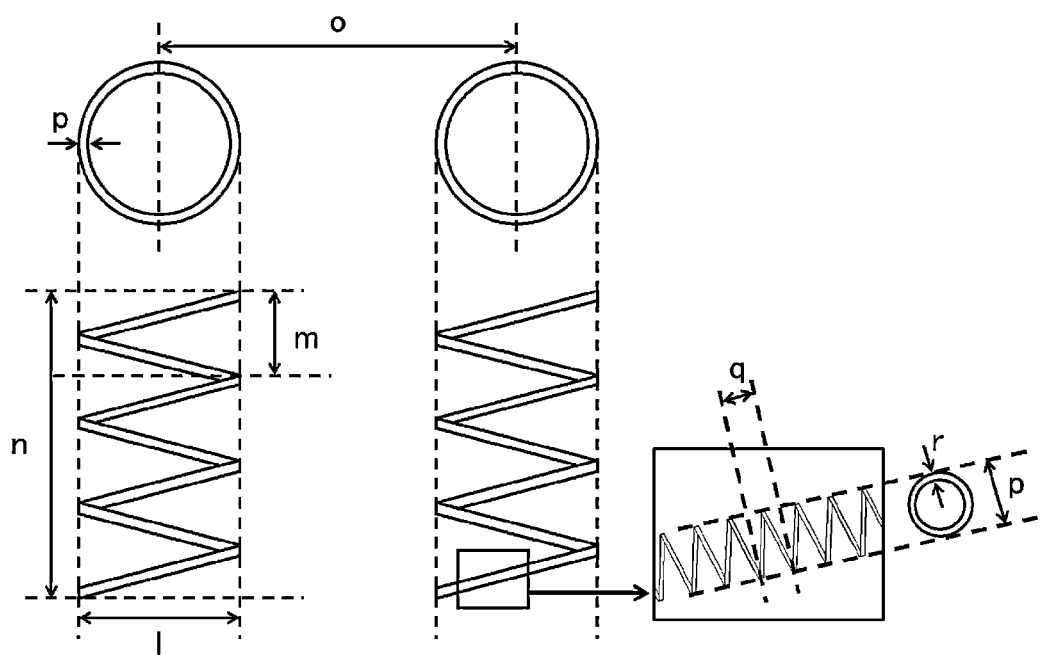
FIG. 23 is a diagram illustrating an aspect of the conductive coil.

FIG. 23 illustrates a mode in which two double coils with the angle θ being 90° are arranged in parallel in the resin. An upper diagram in FIG. 23 illustrates the double coil observed in the center axis direction of the large spiral of the double coil, and a lower diagram illustrates the double coil in a direction at 90° relative to the center axis. In FIG. 23, I represents the average outer diameter of the large spiral, m represents the average winding pitch width of the large spiral, n represents the average length of the double coil in the center axis direction of the large spiral, o represents the average coil alignment pitch, p represents the average outer diameter of the small spiral, q represents the average winding pitch width of the small spiral, and r represents the average wire diameter. When a plurality of double coils are used, the average outer diameter 1 of the large spiral is a value calculated as the average value of the plurality of double coils. In the present embodiment, when the term "average" is used for a parameter of the double coil, calculation is performed for other parameters in a manner similar to that for the average outer diameter. These parameters can each be measured by internal observation using CT-X rays.

The average coil alignment pitch is a parameter set when the conductive members are arranged at an equal interval, and the length of the interval is the average coil alignment pitch. For example, when the conductive coils are arranged in the flat surface direction, it is assumed that lines forming a lattice shape with square cells are assumed to be arranged on the sheet, with a plurality of vertical lines formed at an equal interval and a plurality of lateral lines formed at an equal interval, and with the interval between the vertical lines and the interval between the lateral lines being the same. In this case, the interval between the vertical lines (or lateral lines) with one conductive coil included in each square cell is the average coil alignment pitch. The conductive coils may be arranged at an equal interval, with the length of the interval varying among a plurality of directions. For example, the conductive coils may be arranged at an equal interval with a length X of the interval in the vertical direction and at an equal interval with a length Y of the interval in the lateral direction. In other words, the average coil alignment pitch may be determined with lines forming a lattice shape with rectangular cells instead of the square cells described above, and in this case, the average value of X and Y is the average coil alignment pitch.

The average outer diameter 1 of the large spiral (may also be simply referred to as "large spiral outer diameter"), which is not particularly limited, is typically 10.5 μm or greater, preferably 105 μm or greater, more preferably 210 μm or greater, and still more preferably 315 μm or greater, and is typically 1470 μm or less, preferably 1365 μm or less, more preferably 1050 μm or less, and still more preferably 525 μm or less, for the sake of guaranteeing sufficient electromagnetic wave shielding property. When the center axis of the large spiral and the sheet flat surface forms a right angle therebetween, a smaller outer diameter of the large spiral leads to a large frequency band of the electromagnetic waves that can be effectively shielded. In particular, such a frequency band is likely to shift toward a high frequency band that is 100 GHz or higher. When the angle therebetween is horizontal, a higher shielding performance can be attained when the outer diameter of the large spiral is larger than the lower limit described above because of a longer length of the small spiral in the perpendicular direction over which the effective shielding can be achieved.

The average winding pitch width m of the large spiral (may also be simply referred to as the "winding pitch width of the large spiral"), which is not particularly limited, is typically more than 140 μm (exceeds 140 μm), preferably 175 μm or greater, more preferably 210 μm or greater, and still more preferably 245 μm or greater, and is typically 560 μm or less, more preferably 490 μm or less, still more preferably 420 μm or less, and even more preferably 350 μm or less for the sake of guaranteeing sufficient electromagnetic wave shielding property. When the center axis of the large spiral and the sheet flat surface forms a right angle therebetween, a smaller winding pitch width of the large spiral leads to a large frequency band of the electromagnetic waves that can be effectively shielded. In particular, such a frequency band is likely to shift toward a high frequency band that is 100 GHz or higher. When the angle therebetween is horizontal, the shielding performance is compromised when the winding pitch width of the large spiral is larger than the upper limit described above because of a larger inclination of the small spiral by which the effective shielding can be achieved.

The average length n of the double coil (coil-shaped portion) in the center axis direction of the large spiral (may also be simply referred to as the "length of the double coil in the center axis direction of the large spiral"), which is not particularly limited, is typically 20 μm or greater, preferably 100 μm or greater, more preferably 500 μm or greater, and still more preferably 1000 μm or greater, and is typically 10000 μm or less, preferably 8000 μm or less, more preferably 6000 μm or less, and still more preferably 4000 μm or less, for the sake of guaranteeing sufficient electromagnetic wave shielding property. When a right angle is formed between the center axis of the large spiral and the sheet flat surface, an increase in the length of the double coil in the center axis direction of the large spiral, which does not affect the frequency band of electromagnetic waves that can be effectively shielded, leads to an increase in higher shielding performance. When the horizontal angle is formed, the length of the double coil in the center axis direction of the large spiral does not affect the frequency band of electromagnetic waves that can be effectively shielded or the shielding performance.

The average coil alignment pitch o (may also be simply referred to as "coil alignment pitch"), which is not particularly limited, is typically 420 μm or greater, preferably 500 μm or greater, more preferably 600 μm or greater, and still more preferably 700 μm or greater, and is typically 4000 μm or less, preferably 3000 μm or less, more preferably 2000 μm or less, and still more preferably 1000 μm or less, for the sake of guaranteeing sufficient electromagnetic wave shielding property. When a right angle is formed between the center axis of the large spiral and the sheet flat surface, a longer coil alignment pitch leads to a smaller frequency band of electromagnetic waves that can be effectively shielded. When the horizontal angle is formed, a longer coil alignment pitch leads to a smaller frequency band of electromagnetic waves that can be effectively shielded.

The average outer diameter p of the small spiral (may also be simply referred to as "small spiral outer diameter"), which is not particularly limited, is typically greater than 3.5 µm (exceeds 3.5 µm), preferably 35 µm or greater, more preferably 70 µm or greater, and still more preferably 105 µm or greater, and is typically 490 µm or less, preferably 455 µm or less, more preferably 350 µm or less, and still more preferably 175 µm or less, for the sake of guaranteeing sufficient electromagnetic wave shielding property. When a right angle is formed between the center axis of the large spiral and the sheet flat surface, a larger small spiral outer diameter leads to a smaller frequency band of electromagnetic waves that can be effectively shielded. When the horizontal angle is formed, a larger small spiral outer diameter leads to a smaller frequency band of electromagnetic waves that can be effectively shielded.

The average winding pitch width q of the small spiral (may also be simply referred to as the "winding pitch width of the small spiral"), which is not particularly limited, is typically greater than 20 µm (exceeds 20 µm), preferably 25 µm or greater, more preferably 30 µm or greater, and still more preferably 35 µm or greater, and is typically 200 µm or less, preferably 150 µm or less, more preferably 100 µm or less, and still more preferably 70 µm or less, for the sake of guaranteeing sufficient electromagnetic wave shielding property. When a right angle is formed between the center axis of the large spiral and the sheet flat surface, a larger winding pitch width of the small spiral leads to a smaller frequency band of electromagnetic waves that can be effectively shielded. When the horizontal angle is formed, a larger winding pitch width of the small spiral leads to a smaller frequency band of electromagnetic waves that can be effectively shielded.

The average wire diameter r (may also be simply referred to as "wire diameter"), which is not particularly limited, is typically greater than 1 µm (exceeds 1 µm), preferably 10 µm or greater, more preferably 20 µm or greater, and still more preferably 30 µm or greater, and is typically 140 µm or less, preferably 130 µm or less, more preferably 100 µm or less, and still more preferably 50 µm or less, for the sake of guaranteeing sufficient electromagnetic wave shielding property. When a right angle is formed between the center axis of the large spiral and the sheet flat surface, a larger wire diameter leads to a larger frequency band of electromagnetic waves that can be effectively shielded. When the horizontal angle is formed, a larger wire diameter leads to a larger frequency band of electromagnetic waves that can be effectively shielded.

The average winding number of the large spiral (may also be simply referred to as the "winding number of the large spiral"), which is not particularly limited, is typically 4 or greater, preferably 5 or greater, and more preferably 6 or greater, and is typically less than 14, preferably 11 or less, more preferably 10 or less, and still more preferably 8 or less, for the sake of guaranteeing sufficient electromagnetic wave shielding property. When the center axis of the large spiral and the sheet flat surface direction forms a right angle therebetween, a smaller winding number of the large spiral leads to a large frequency band of the electromagnetic waves that can be effectively shielded. In particular, such a frequency band is likely to shift toward a high frequency band that is 100 GHz or higher. When the angle therebetween is horizontal, the shielding performance is compromised when the winding number of the large spiral falls below the lower limit described above because of a larger inclination of the small spiral by which the effective shielding can be achieved.

The average winding number of the small spiral (may also be simply referred to as the "winding number of the small spiral"), which is not particularly limited, is typically 24 or greater, preferably 36 or greater, more preferably 63 or greater, and still more preferably 108 or greater, and is typically 942 or less, preferably 603 or less, more preferably 419 or less, and still more preferably 308 or less, for the sake of guaranteeing sufficient electromagnetic wave shielding property. The range of the winding number described above is a particularly preferable range in a case where the center axis of the large spiral and the sheet flat surface form a right angle.

(Characteristics of Double Coil)
Volume Resistivity

The volume resistivity of the double coil is not particularly limited, and it may be any value approximately sufficient for making a minute current flow. Through study, the present inventors have found that the oscillation frequency is approximately the same between copper with a volume resistivity of 1.55 µΩ cm (0° C.) and tungsten with a volume resistivity of 4.9 µΩ cm (0° C.). An example of the value approximately sufficient for making a minute current flow described above includes a volume resistivity of 3352.8 µΩ cm (20° C.) in a case where carbon (graphite) is used.

Thermal Conductivity

The thermal conductivity of the double coil is not particularly limited. Through study, the present inventors have found that the oscillation frequency is approximately the same between copper with a thermal conductivity of 394 W/m K and tungsten with a thermal conductivity of 174.3 W/m K.

[Resin]
(Configuration of Resin)

The type of resin is not particularly limited as long as the double coil described above can be contained. Thus, the resin may be thermosetting resin or thermoplastic resin. Preferably, thermosetting resin is used because the electromagnetic wave shielding sheet can have high temperature depending on its use. Examples of the thermosetting resin include thermosetting resin, photocurable resin. Examples of the thermosetting resin include thermosetting acrylic resin, unsaturated polyester resin, epoxy resin, melamine resin, phenol resin, silicone resin, polyimide resin, urethane resin. Examples of the photocurable resin include photocurable epoxy resin, photocurable polyester, photocurable vinyl compound, photocurable epoxy (meth)acrylate, photocurable urethane (meth)acrylate. Among these, for the sake of heat resistance, epoxy resin or photocurable epoxy resin is preferable. One of these types of resin may be used, or any two or more of these types of resin may be used in combination of any ratio.

The content of the resin in the sheet, which is not particularly limited, is typically 60 wt. % or greater, preferably 80 wt. %. or greater, more preferably 90 wt. % or greater, even more preferably 95 wt. % or greater, and even more preferably 97 wt. % or greater, and is typically 99.99 wt. % or less, preferably 99.90 wt. % or less, more preferably 99.5 wt. % or less, and even more preferably 99.0 wt. % or less, for guaranteeing sufficient electromagnetic wave shielding property and in terms of raw material cost.

(Characteristics of Resin)
Refractive Index

The refractive index of the resin, which is not particularly limited, is typically 1.35 to 1.76, and is preferably 1.55 to 1.61 achieved by epoxy resin, for the sake of higher electromagnetic wave shielding property. The refractive index can be measured using a known method.

[Composition]

The composition for a resin molded body that is another embodiment of the present disclosure (also simply referred to as "composition for a resin molded body" in the description of the present embodiment) is a composition for a resin molded body (an electromagnetic wave shielding sheet in particularly) that includes resin and a conductive coil, with a conductive member forming the conductive coil having a spiral shape.

The resin and the conductive coil (double coil) in the present embodiment may be the resin and the double coil in the embodiment described above. The configuration, characteristics, and applications of the resin molded body obtained using the composition according to the present embodiment may be the configuration, characteristics, and applications of the resin molded body described above or below. The composition may include other materials described below. A solvent and a polymerization initiator may be further included. For the types and the contents of the solvent and the polymerization initiator, conditions in the description of the preparing and curing of the resin composition including the conductive coil in the first manufacturing method described below may be applied.

[Sheet]

(Configuration of Sheet)

The shape of the electromagnetic wave shielding sheet is not particularly limited as long as it is a sheet shape, and can be changed as appropriate depending on the position where the sheet is disposed. The sheet may be a single layer sheet, or may be a laminated sheet. In a case of the laminated sheet, a plurality of the sheets of the present embodiment may be laminated in one mode, and other sheets may be laminated to provide various functions in another mode.

The thickness of the sheet, which is not particularly limited, is typically 10 µm or greater, preferably 20 µm or greater, even more preferably 50 µm or greater, still more preferably 100 µm or greater, and is typically 10 mm or less, preferably 5 mm or less, more preferably 3 mm or less, and even more preferably 1.5 mm or less, for reducing the size, weight, and thickness of modern electronic devices represented by cell phones, smartphones, tablets, or the like.

The shape of the sheet is flat, but may have unevenness as long as the sheet can be regarded as being approximately flat, and may be partially curved. Furthermore, the surface shape of the sheet may be a circular shape, or a polygonal shape such as a triangle or a rectangle.

The number of the double coils in the sheet, which is not particularly limited, is typically 6 coils/cm$^2$ or greater, preferably 11 coils/cm$^2$ or greater, more preferably 25 coils/cm$^2$ or greater, even more preferably 100 coils/cm$^2$ or greater, and is typically 700 coils/cm$^2$ or less, preferably 400 coils/cm$^2$ or less, more preferably 280 coils/cm$^2$ or less, and even more preferably and 200 coils/cm$^2$ or less, relative to the area in the sheet flat surface direction, for the sake of guaranteeing sufficient electromagnetic wave shielding property. When a right angle is formed between the center axis of the large spiral and the sheet flat surface, a larger number of double coils leads to a shorter inter-coil distance, resulting in a larger frequency band of electromagnetic waves that can be effectively shielded. When the horizontal angle is formed, a larger number of double coils leads to a shorter inter-coil distance, resulting in a larger frequency band of electromagnetic waves that can be effectively shielded.

The number of double coils described above can be measured by internal observation using CT-X rays.

The mode of how the double coils are contained in the sheet is not particularly limited. Any number of double coils may be disposed at any positions. Alternatively, the plurality of double coils may be arranged at an equal interval in the sheet surface direction.

The sheet may include a material (other material) other than the double coil and the resin described above, such as, for example inorganic filler other than the double coil. For example, the coefficient of linear expansion of the sheet can be adjusted by the addition of the inorganic filler, which makes it easy to prevent the sheet from having warpage, deflection, waviness, and the like.

The content of the inorganic filler other than the double coils in the sheet is not particularly limited, and may be set to any content as long as the effects of the present embodiment can be achieved.

(Characteristics of Sheet)

Electromagnetic Wave Shielding Property

In the present disclosure, the electromagnetic wave shielding property is evaluated by evaluating power transmittance $T(\omega)$ through the method described below. The evaluation method is a method based on terahertz time domain spectroscopy used in a transmittance measurement experiment.

FIG. 4 is a schematic view of an experimental apparatus. First, light from a femtosecond laser is divided into pump light and probe light by a beam splitter. The pump light functions as light that excites terahertz waves. The probe light is for adjusting the timing of measuring the terahertz waves. The detection timing is shifted by changing the optical path length of the probe light through movement of a delay stage. An electric field $E_{sam}(t)$ after the terahertz waves have passed through the sample and an electric field $E_{ref}(t)$ after the terahertz waves have passed through the air without the sample are detected. Using these values, a complex refractive index, a complex permittivity, transmittance, power spectrum, and the like are obtained.

Using the data obtained from the measurement described above, the transmittance is obtained through Fourier transform. The Fourier transform is performed on the obtained electric field waveforms $E_{sam}(t)$ and $E_{ref}(t)$, and $E_{sam}(\omega)$ and $E_{ref}(\omega)$ are obtained respectively. Formula (A) below expresses the power transmittance $T(\omega)$.

[Math. 1]

$$T(\omega) = \frac{|E_{sam}(\omega)|^2}{|E_{ref}(\omega)|^2} \qquad (A)$$

The transmittance described above can be measured by a terahertz spectroscopy system (TAS 7500 TSH manufactured by Advantest Corporation, for example).

From the power transmittance $T(\omega)$ described above, shielding performance L (dB) can be obtained using Formula (B) below.

$$L = 10 \times \text{Log}_{10}(T(\omega)/100) \qquad (B)$$

The shielding performance L, which is not particularly limited, is typically −2 dB or less, preferably −5 dB or less, and more preferably −10 dB or less. For preventing the malfunctioning of electronic devices such as computers, the shielding performance L is typically −20 dB or less, preferably −30 dB or less, more preferably −40 dB or less, even more preferably −60 dB or less, and further more preferably −80 dB or less. The lower limit of the shielding performance L, which is not necessarily set, is typically −90 dB or greater. The power transmittance $T(\omega)$ of the electromagnetic waves is expressed as −20 dB (shield ratio: 90%) when the electromagnetic waves are reduced to $1/10$, is expressed as −40 dB (shield ratio: 99%) when the electromagnetic waves are reduced to $1/100$, is expressed as −60 dB (shield ratio: 99.9%) when the electromagnetic waves are reduced to $1/1000$, and is expressed as −80 dB (shield ratio: 99.99%) when the electromagnetic waves are reduced to $1/10000$.

<Method for Manufacturing Resin Molded Body>

Embodiments of various methods of manufacturing a resin molded body will be described below. The method for manufacturing the resin molded body described above is not limited to these manufacturing methods. Examples of usable methods other than the first manufacturing method and the second manufacturing method described below include the manufacturing method for Example 1 of Experiment 1 in Example described below. Manufacturing conditions applicable to various other embodiments can be applied to these embodiments. The condition for the resin molded body described above can be applied to the conditions of the manufacturing methods described below, within a range of applicability.

<First Manufacturing Method>

A first method for manufacturing a resin molded body that is another embodiment of the present disclosure (also simply referred to as "first manufacturing method" in the description of the present embodiment) is a method for manufacturing a resin molded body that includes resin and a conductive coil, the method including:

preparing a composition including a resin composition including the resin and the conductive coil, and then curing the composition, in which a conductive member forming the conductive coil has a spiral shape.

The first manufacturing method including the producing and curing of the composition described above may further include other steps. An example of the first manufacturing method will be described below.

Preparing and Curing of Resin Composition Including Conductive Coil

The first manufacturing method includes preparing a composition including a resin composition including the resin and the conductive coil (double coil), and then curing the composition. The method for preparing the composition is not particularly limited, and may be a method for adding the resin, conductive material, and other materials described above together in a solvent, and mixing them. The method for the mixing is not particularly limited, and a known method can be used.

The type of solvent is not particularly limited as long as the above-described resin and other materials can be dissolved in it. If the resin composition can be molded without using the solvent, the solvent may not be used.

A curing agent may be added depending on the type of resin used. The curing agent of a known type may be used as appropriate depending on the resin. The content of the curing agent in the composition can be, for example, 0.05 to 15 wt. %.

Depending on the type of resin used, a polymerization initiator can be added. For example, as a thermal polymerization initiator, a thermal radical generator such as a peroxide such as benzoyl peroxide can be used. As a photopolymerization initiator, a photoradical generator, a photocation generator, a photoanion generator, or the like can be used.

An example of the method for curing the composition is not particularly limited, and includes a method using heat, light such as ultraviolet ray.

<Second Manufacturing Method>

A second method for manufacturing a resin molded body that is another embodiment of the present disclosure (also simply referred to as "second manufacturing method" in the description of the present embodiment) is a method for manufacturing a resin molded body that includes resin and a conductive member, the method including:

preparing a resin sheet including a pocket;

arranging the conductive coil oriented, in the pocket; and pouring a composition including resin into the pocket in which the conductive coil is arranged, and then curing the composition, in which a conductive member forming the conductive coil has a spiral shape.

The second manufacturing method including the preparing of the resin sheet, the arranging of the conductive coil oriented, and the pouring and curing of the composition described above may further include other steps. An example of the second manufacturing method including such other steps will be described below.

[Preparing of Resin Composition]

The second manufacturing method may include preparing a resin composition by dissolving and mixing the above-described resin or other materials in a solvent. The method for the mixing is not particularly limited, and a known method can be used.

Regarding whether to use the solvent as well as the type and the content of the solvent, the conditions of the preparing of the resin composition in the first manufacturing method described above may be similarly applied.

[Preparing of Resin Sheet]

The second manufacturing method includes preparing a resin sheet including a pocket. A method for preparing the resin sheet including a pocket is not particularly limited, and includes, for example, a molding method for pouring, into a mold with which the pocket can be formed, the resin composition obtained in the preparing of the resin composition described above, and curing the resin composition using heat, light such as ultraviolet ray. The method for production further includes a method for curing the resin composition described above using a known method to mold a resin sheet not including a pocket, and then performing laser processing to form the pocket. The molding may be performed with or without pressure applied. When the pressure is applied, for example, press molding can be used.

The size of the pocket largely affects the inclination of the conductive coil (double coil), and thus is set in accordance with the mode of use of the sheet finally obtained. For example, when the angle formed between the center axis of the large spiral of the double coil and the sheet flat surface direction is to be approximately 90°, the size of the pocket and the size of the double coil (the shape of the cross section in a direction perpendicular to the center axis) may be set to be substantially the same.

The pocket may or may not be formed through the sheet.

Parameters such as the number of pockets and the thickness of the sheet may be set as appropriate based on the description of the parameters of the configuration of the resin molded body described above.

[Arranging of Conductive Coil]

The second manufacturing step includes arranging the double coil, in the pocket of the sheet obtained by the preparing of the resin sheet described above. The double coil may or may not be oriented. A method for orienting the double coil includes a method for arranging, instead of the conductive member 12 in the arranging of the conductive member, the conductive coil (double coil) to be at a desired angle with respect to a pocket 13 of a pocket resin sheet 10 including a cured object 11 of the resin composition (also simply referred to as "resin 11"). In this process, when the pocket is formed through the sheet, an adhesive sheet may be arranged below the sheet, and the double coil may be oriented by being adhered to the adhesive sheet to be held at the desired angle in the pocket. The adhesive sheet may be removed from the resin sheet after pouring and curing of the composition described below.

[Pouring and Curing of Composition]

The second manufacturing step includes pouring, into the pocket in which the double coil is arranged in the arranging of the conductive coil described above, a composition including resin, and then curing the composition. The composition including the resin poured is preferably the resin prepared in the preparing of the resin composition described above.

A method for curing the composition is not particularly limited, and can be changed as appropriate depending on the type of resin. An example of the method includes a method for curing using heat, light such as ultraviolet ray. When the thermoplastic resin is used, and the composition described above is prepared in a molten state achieved with heat applied, the curing may be performed by leaving it to stand still or through processing such as cooling processing.

<Applications of Resin Molded Body>

As described above, the applications of the resin molded body described above, which are not particularly limited, include an electromagnetic wave shield.

Other embodiments of the invention of the present application are devices including the resin molded body described above such as:

- an electric communication device such as an electronic device, a cable, a smartphone, a tablet, a smart watch, a smart security device, a monitoring device, or smart appliance;
- a consumer electronic device such as a computer circuit, a radio transmitter (including a smartphone), an electric motor, a flat panel display, or a liquid crystal display (LCD); an automobile device such as a safety system, a mobile medium, communications, a wireless headset, a battery-powered, electric, or hybrid powertrain, or a high-voltage battery system;
- a medical device such as a smart bed, a ventilator, a CT scan machine, or a transducer that needs to acquire information such as pulse or blood pressure and convert it into an electronic signal;
- an aerospace device or a defense device such as an aircraft, a vehicle, combat equipment, a weapon, an elastomeric gasket, a conductive paint, or an EMI shielded display;
- a system such as a railroad system, a mass transit system, a high voltage contact switching system, a signaling system, or a control system; or
- a digital weapon such as an electromagnetic bomb based on high-power surges, or an electronic bomb; or
- other devices (devices other than those listed above that may include the resin molded body described above).

The mode of use of the resin molded body of the embodiments described above is not particularly limited, and can be any mode including the resin molded body as its member. The resin molded body of the embodiments is particularly preferably used for the electromagnetic wave shielding sheet.

In particular, when the resin molded body is used as the electromagnetic wave shielding sheet, the electromagnetic wave shielding sheet can be used in any way for the application of blocking electromagnetic waves. For example, the electromagnetic wave shielding sheet may be installed to surround an electronic device that may malfunction due to electromagnetic waves, to prevent the malfunctioning. In particular, the electromagnetic wave shielding sheet described above is excellent in blocking electromagnetic waves in a high frequency band compared with a known electromagnetic wave shielding sheet, to attain shielding from electromagnetic waves from communication devices such as a cell phone and a smartphone that are expected to be used at higher frequencies, that is, in a higher frequency band such as 100 GHz or higher, for the sake of higher speed, larger capacity, shorter delay, and the like, and thus can be applied to a wider range of fields than the known electromagnetic wave shielding sheet. With the sheet described above, when a direction of arrival of electromagnetic waves from the outside and the sheet flat surface are perpendicular to each other, particularly a large electromagnetic wave shielding effect can be attained.

EXAMPLES

Hereinafter, the present disclosure will be specifically described with reference to Examples. The present disclosure is not to be interpreted as being limited to Examples described below.

<Experiment A>
<Experiment A1: Simulation Evaluation>

A simulation experiment was performed to evaluate the effect of the inclination of the center axis of the conductive material with respect to the electromagnetic wave shielding performance L (dB) using ANSYS HFSS (registered trademark), which is full wave 3D electromagnetic field software manufactured by CYBERNET SYSTEMS CO., LTD.

[X-Axis Inclination Experiment]

Figure 9:
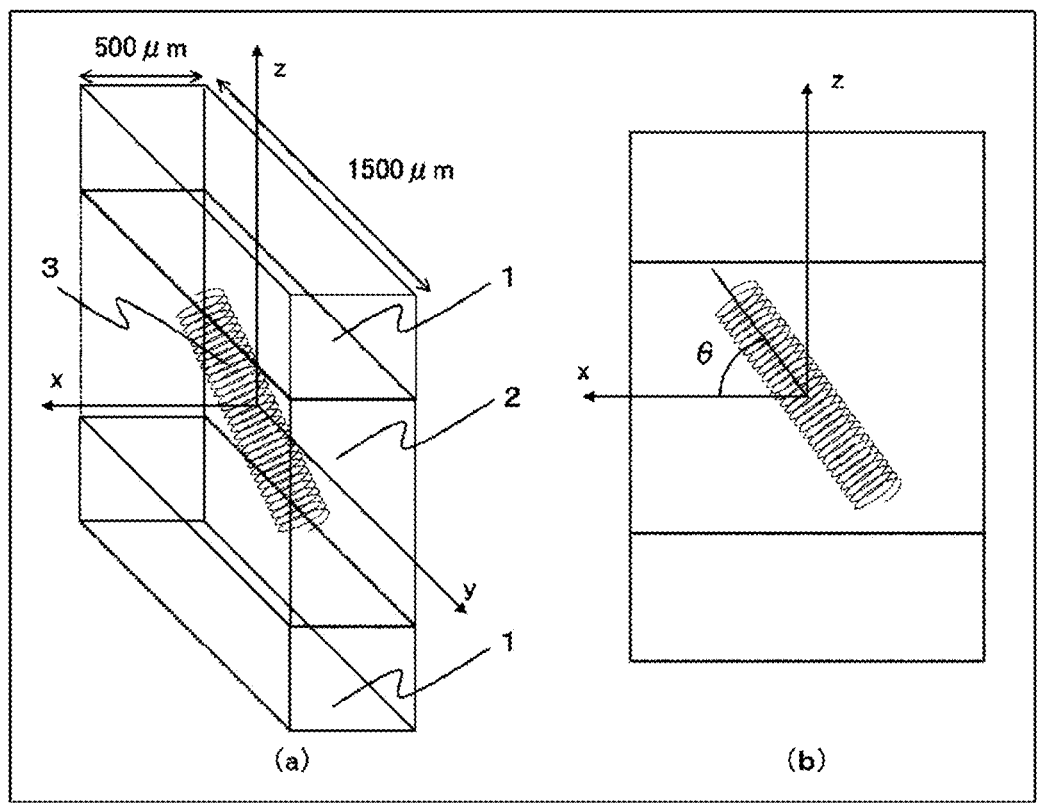
FIG. 9 is a diagram illustrating a setting condition for a simulation of experiment A1 (x-axis inclination experiment) of Example.

An x-axis inclination experiment is performed using a copper (Cu) coil as a material of the conductive member, with an angle between the center axis of the coil and a y axis set to be 90°, and with an angle between the center axis of the coil and an x-axis set to be 0, as illustrated in FIG. 9 (air 1, substrate 2, and copper coil 3). The experiment conditions for this simulation experiment are as follows. In FIG. 9, (a), the polarization direction of the electric field of the incident electromagnetic waves was defined as the −y-axis direction, and the polarization direction of the magnetic field was defined as the −x-axis direction.

Substrate material: epoxy resin (real part of permittivity was 3.65 and imaginary part of permittivity was 0.05)
Substrate thickness: 1000 μm
Coil plasma angular frequency ($\omega_p$): $1.12 \times 10^{16}$ rad/s
Coil damping angular frequency ($\omega_\tau$) $1.38 \times 10^{13}$ rad/s
Coil outer diameter: 153.6 μm
Wire outer diameter: 20 μm
Coil winding pitch: 40 μm
Winding number 24.33
Coil alignment pitch: 1500 μm
Initial mesh resolution: Coarse FIG. 10 to FIG. 13 show results of comparison in the electromagnetic wave shielding performance L under conditions that the angle θ between the coil center axis and the x-axis was 0°, 10°, 20°, 30°, 40°, 50°, 60°, 70°, 80°, and 90°, with the resolution of the initial mesh set to Coarse and Normal. The electromagnetic wave shielding performance L (dB) was calculated using Formulae (A) and (B) described above.

[Y-Axis Inclination Experiment]

Figure 14:
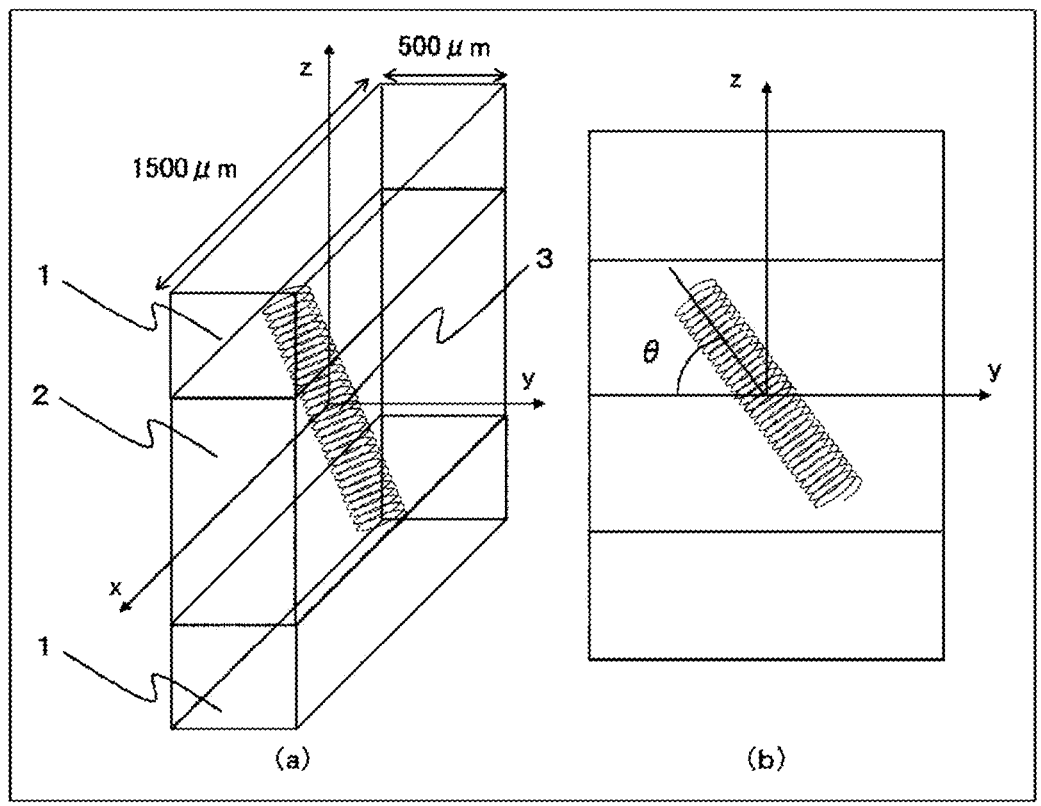
FIG. 14 is a diagram showing a setting condition for a simulation of experiment A1 (y-axis inclination experiment) of Example.
Figure 15:
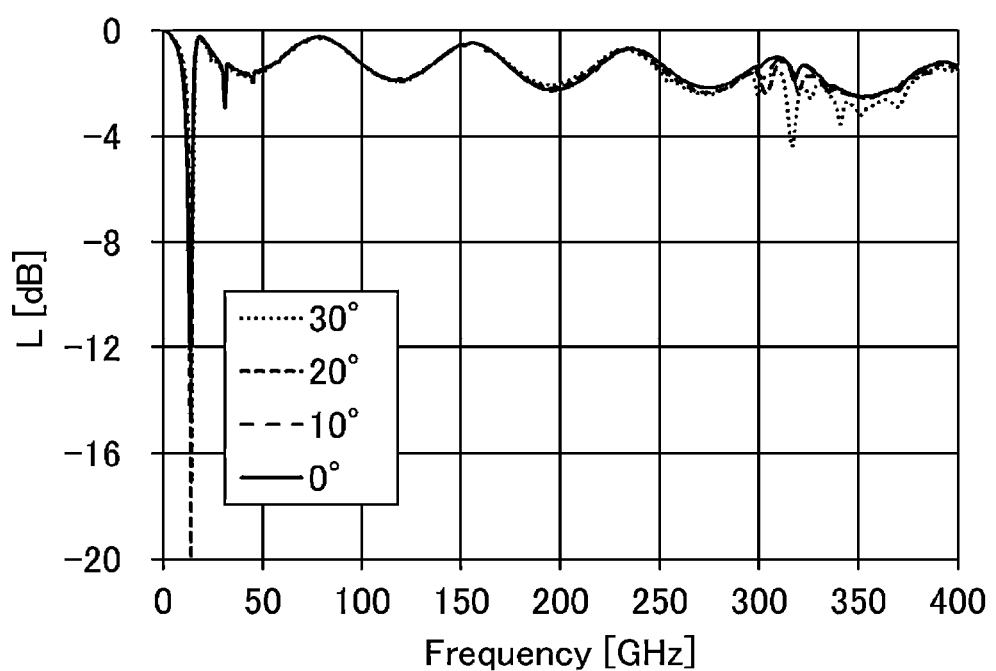
FIG. 15 is a diagram showing a result (θ=0 to 30°) of the simulation of experiment A1 (y-axis inclination experiment) of Example.
Figure 16:
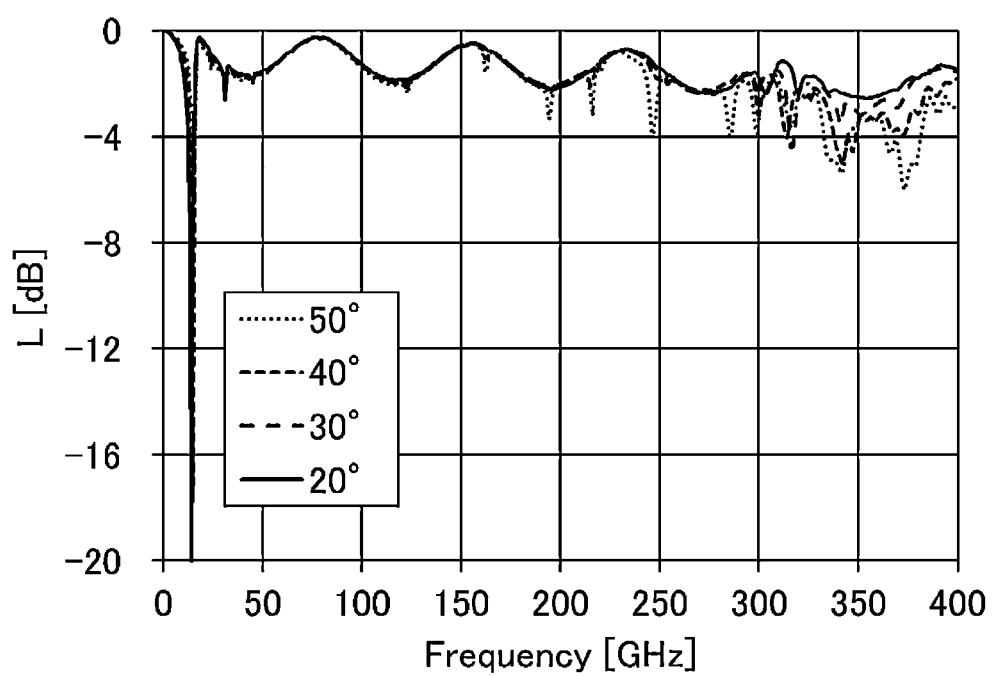
FIG. 16 is a diagram showing a result (θ=20 to 50°) of the simulation of experiment A1 (y-axis inclination experiment) of Example.
Figure 17:
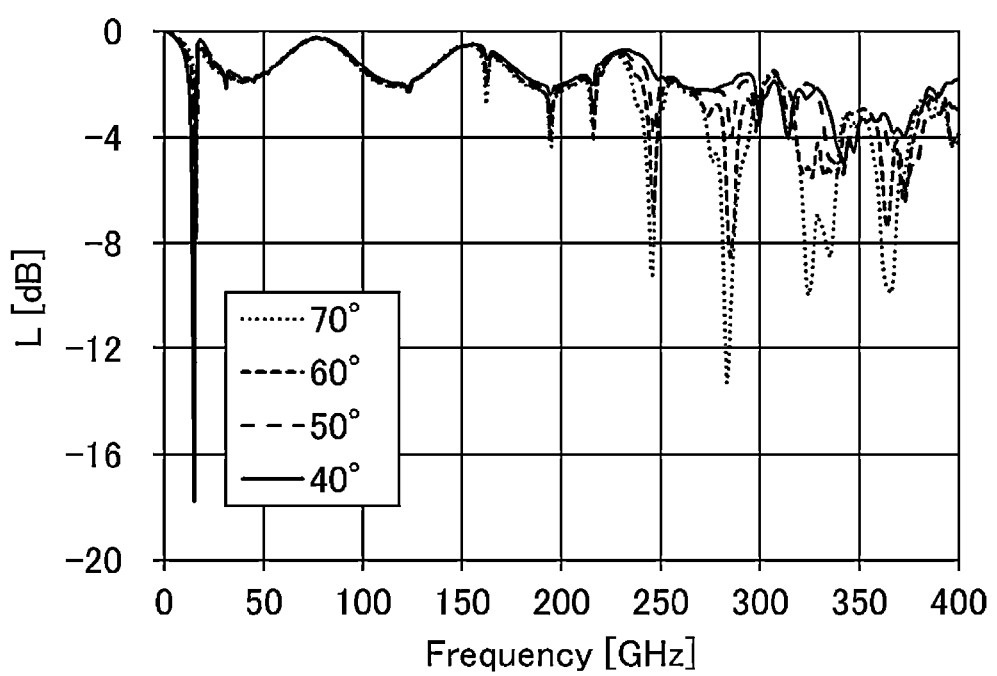
FIG. 17 is a diagram showing a result (θ=40 to 70°) of the simulation of experiment A1 (y-axis inclination experiment) of Example.
Figure 18:
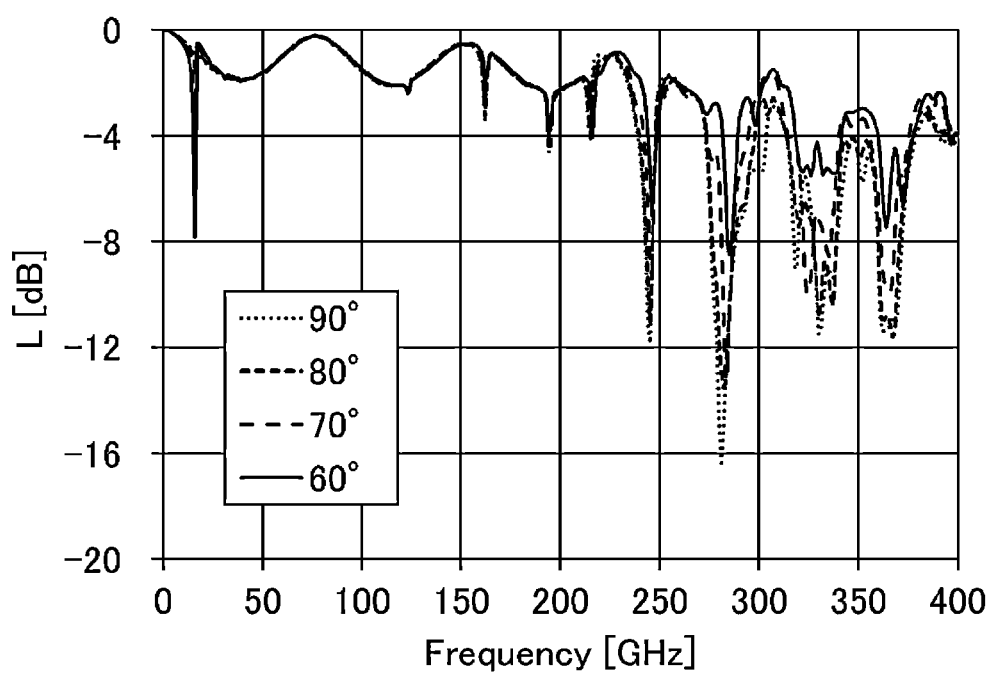
FIG. 18 is a diagram showing a result (θ=60 to 90°) of the simulation of experiment A1 (y-axis inclination experiment) of Example.

Under the experiment conditions similar to those for the x-axis inclination experiment described above, an y-axis inclination experiment is performed using a copper (Cu) coil as a material of the conductive member, with an angle between the center axis of the coil and the x axis set to be 90°, and with an angle between the center axis of the coil and the y-axis set to be 0, as illustrated in FIG. 14 (air 1, substrate 2, and copper coil 3).

FIG. 15 to FIG. 18 illustrate results of comparison in the electromagnetic wave shielding performance L under conditions that the angle θ between the coil center axis and the y-axis was 0°, 10°, 20°, 30°, 40°, 50°, 60°, 70°, 80°, and 90°, with the resolution of the initial mesh set to Coarse and Normal, as in the x-axis inclination experiment described above. The electromagnetic wave shielding performance L (dB) was calculated using Formulae (A) and (B) described above.

As can be seen in FIG. 10 to FIG. 13 and FIG. 15 to FIG. 18, a larger angle between the sheet flat surface and the center axis leads to a lower electromagnetic wave shielding performance L, that is, an improved electromagnetic wave shielding property in a high frequency band, that is, at 100 GHz or higher and around 300 GHz in particular. Regarding the second resin molded body, the double coil having the large spiral and the small spiral includes many portions with an angle providing excellent effects compared with the single coil without the small spiral, and thus features excellent electromagnetic wave shielding property.

<Experiment A2: Evaluation of Actual Sheet>

[Sample Preparation]

<Raw Materials>

Base material 1: Mold resin R4212-2 for semiconductors manufactured by NAGASE & CO., LTD.
The base material 1 was configured by 89 wt. % of silica filler Sift, 10 wt. % of epoxy resin, and others (such as a flame retardant, carbon black, and an ion replenishment agent). The refractive index at 500 GHz was 1.93.

Base material 2: A mixture of cold-embedded resin JP-21111001 (a polyester resin with a refractive index of 1.69 at 500 GHz) manufactured by Struers K.K. and a curing agent (M agent) manufactured by Struers K.K.
The mixing ratio was cold-embedded resin:curing agent=100 ml:1.5 ml, and the curing time was 40 minutes at room temperature.

Conductive member: A coil of a mode in Table 1 described below was used as the conductive member in each Example.

Example A1

The base material 1 described above was poured in a mold with which a sheet can be prepared to have an overall size of 30 mm (vertical)×30 mm (lateral), and to have pockets (through holes) each having an outer diameter of 350 μm in an arrangement of 30 pockets (vertical)×30 pockets (lateral) (lattice arrangement) with an interval defined by the distance between the centers of the holes being 1 mm. The distance between centers of the holes corresponds to the coil alignment pitch.

The pockets in the lattice arrangement were placed at the center of the sheet, with the center of the lattice arrangement overlapping the center of the sheet. Then, the base material 1 described above was heated at a curing temperature of 120° C. for 10 minutes to obtain the cured sheet, and then the cured sheet was placed in an oven to be heated at 150° C. for 60 minutes. Thus, a pocket-equipped sheet 1 is obtained.

Then, the metal coils were arranged in the respective pockets of the pocket-equipped sheet, with the average angle of the center axes of the metal coils and the sheet flat surface direction being 81.4°. The metal coils were each configured of a metal wire having a circular cross section. The thickness of the metal wire (wire diameter) was 30 μm, the outer diameter of the metal coil was 300 μm, the length in the center axis direction was 3 mm, and the winding pitch width was 60 μm. The coil alignment pitch was the distance between the centers of the holes of the pockets described above. While the length of the metal coil used in the center axis direction was 3 mm, the metal coil was ground to have a length of 1 mm in the thickness direction of the sheet in the final sheet grinding step. Also in other Examples and Comparative Examples described below, the length of the metal coil used in the center axis direction was 3 mm, but the metal coil was ground to have a length that is the same as the final sheet thickness in the sheet thickness direction, in the final sheet grinding step. The metal wire was made of copper.

Then, while holding the arrangement of the metal coils described above, resin that is the same as the base material 1 described above was poured into each pocket of the sheet, and was cured under a condition that is the same as the curing condition described above. Thereafter, the sheet thus obtained was ground to have a thickness of 1 mm, whereby a sheet 1 having a thickness of 1 mm was obtained. The average winding number of the metal coils was 17, the average weight per metal coil was 0.00043489 g, and the content of the metal coil in the sheet was 0.0675 g/cm³.

Example A2

A sheet 2 was prepared and obtained through a method that is the same as that in Example A1, except that the coil alignment pitch of the metal coils was changed to 2 mm, the number of metal coils was changed to 15 (vertical)×15 (lateral), and the average angle between the center axes of the metal coils and the sheet flat surface direction was changed to 72.8°. The content of the metal coils in the sheet 2 was 0.0169 g/cm³.

Example A3

A sheet 3 was prepared and obtained through a method that is the same as that in Example A1, except that the resin used was changed to the base material 2, the material of the metal wire was changed to tungsten, the coil alignment pitch was changed to 0.75 mm, the number of metal coils was changed to 40 (vertical)×40 (lateral), and the average angle between the center axes of the metal coils and the sheet flat surface direction was changed to 72.1°. The average winding number of the metal coils was 33, and the content of the metal coils in the sheet 3 was 0.2577 g/cm³.

Example A4

A sheet 4 was prepared and obtained through a method that is the same as that in Example A1, except that the resin used was changed to the base material 2, the material of the metal wire was changed to tungsten, the coil outer diameter was changed to 200 μm, the coil alignment pitch was changed to 0.75 mm, the number of metal coils was changed to 40 (vertical)×40 (lateral), and the average angle between the center axes of the metal coils and the sheet flat surface direction was changed to 81.0°. The average winding number of the metal coils was 33, and the content of the metal coils in the sheet 4 was 0.1718 g/cm³.

Example A5

A sheet 5 was prepared and obtained through a method that is the same as that in Example A1, except that the resin used was changed to the base material 2, the material of the metal wire was changed to tungsten, the metal coil outer diameter was changed to 100 µm, the coil alignment pitch was changed to 0.75 mm, the number of metal coils was changed to 40 (vertical)×40 (lateral), and the average angle between the center axes of the metal coils and the sheet flat surface direction was changed to 81.2°. The average winding number of the metal coils was 33, and the content of the metal coils in the sheet 5 was 0.0859 g/cm³.

Example A6

A sheet 6 was prepared and obtained through a method that is the same as that in Example A1, except that the resin used was changed to the base material 2, the material of the metal wire was changed to tungsten, the metal coil outer diameter was changed to 100 µm, the coil alignment pitch was changed to 0.50 mm, the number of metal coils was changed to 60 (vertical)×60 (lateral), and the average angle between the center axes of the metal coils and the sheet flat surface direction was changed to 83.4°. The average winding number of the metal coils was 33, and the content of the metal coils in the sheet 6 was 0.1933 g/cm³.

Comparative Example A1

A sheet 7 was prepared and obtained through a method that is the same as that in Example A1, except that the coil alignment pitch of the metal coils was changed to 3 mm, the number of metal coils was changed to 10 (vertical)×10 (lateral), and the average angle between the center axes of the metal coils and the sheet flat surface direction was changed to 23.6°. The average winding number of the metal coils was 17, and the content of the metal coils in the sheet 7 was 0.0075 g/cm³.

Comparative Example A2

Figure 19:
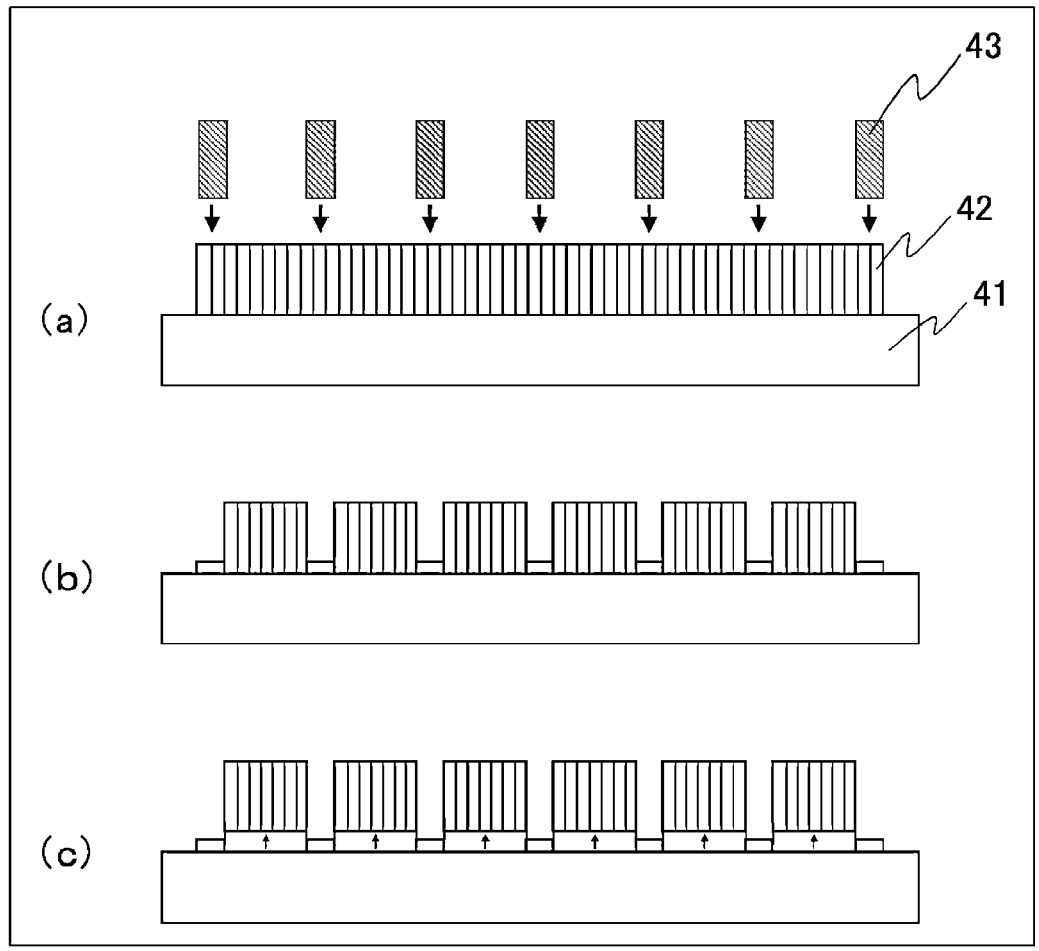
FIG. 19 is a diagram illustrating a method for preparing a continuous horizontal coil of Comparative Example A2 of Experiment A2 of Example.

A sheet was prepared through the following operation using a wire bonder manufactured by Hesse Mechatronics Inc. First of all, as illustrated in FIG. 19, (a) and FIG. 19, (b), metal coils 42 made of copper that have the thickness (wire diameter), the outer diameter, and the winding pitch width that are the same as those in Example A1, as well as a length of 1 mm in the center axis direction, were arranged in parallel to form 15 lines on an aluminum plate 41. Then, each of the coils was struck by a wedge tool 43 at an interval of 1 mm. Thus, the coils were partially crushed. Then, as illustrated in FIG. 19, (c), tweezers were inserted below the uncrushed portion, to lift the portion, and this state was held (the coils in this state are referred to as a continuously horizontal coil). The number of metal coils was the number of the uncrushed portions that are in a 15 (vertical)×15 (lateral) lattice arrangement, with the vertical direction being the center axis direction of the metal coils. The length of the metal coils in the center axis direction was the length of the uncrushed portion, and was 0.7333 mm. The coil alignment pitch is the interval of striking by the wedge tool, and was 2 mm.

Then, the above-described base material 1 was poured onto the aluminum plate to include the continuous horizontal coil described above, cured under the condition that is the same as the resin curing condition in Example A1, and then the resultant sheet was peeled from the aluminum plate, whereby the cured sheet was obtained. The sheet thus prepared had an overall size of 3 cm×3 cm. Finally, the cured sheet thus obtained was ground to have a thickness of 1 mm. Thus, a sheet 8 having a thickness of 1 mm was obtained. The average winding number of the metal coils was 17, the average angle between the center axes of the metal coils and the flat surface direction of the sheet 8 was 10.4°, and the content of the metal coils in the sheet 8 was 0.0292 g/cm³. The sheet 8 was prepared with the metal coils in the lattice arrangement placed at the center of the sheet, that is, with the center of the lattice arrangement overlapping the center of the sheet.

Comparative Example A3

A sheet 9 was prepared and obtained through a method that is the same as that in Comparative Example A2, except that the coil alignment pitch of the metal coils was changed to 3 mm, the number of metal coils was changed to 30 (vertical)×30 (lateral), and the average angle between the center axes of the metal coils and the sheet flat surface direction was changed to 10.6°. The average winding number of the metal coils was 17, and the content of the metal coils in the sheet 9 was 0.0205 g/cm³.

Comparative Example A4

A sheet 10 was obtained by curing the base material 1 under a condition that is the same as the resin curing condition in Example described above, without using the metal coils.

Comparative Example A5

A sheet 11 was prepared and obtained through a method that is the same as that in Example A1, except that the metal coils were changed to cylinders made of copper and having an outer diameter of 30 µm, the alignment pitch of the cylinders was 1.0 mm, the number of cylinders was 30 (vertical)×30 (lateral), and the average angle between the center axes of the cylinders and the sheet flat surface direction was 82.7°. The content of the cylinders in the sheet 11 was 0.0063 g/cm³.

Comparative Example A6

A sheet 12 was prepared and obtained through a method that is the same as that in Comparative Example A5, except that the outer diameter of the cylinders was changed to 300 µm, the alignment pitch of the cylinders was changed to 2.0 mm, the number of cylinders was changed to 15 (vertical)× 15 (lateral), and the average angle between the center axes of the cylinders and the sheet flat surface direction was changed to 82.8°. The content of the cylinders in the sheet 12 was 0.1583 g/cm³.

[Evaluation of Characteristics]
(Electromagnetic Wave Shielding Property)

The electromagnetic wave shielding property was evaluated by measuring the power transmittance $T(\omega)$ using a terahertz spectroscopy system (TAS 7500 TSH manufactured by Advantest Corporation). An aperture with a diameter of 10 mm was used. A measurement target sample was obtained by cutting each of the sheets described above into rectangular parallelepiped bodies with a length of one side of 30 mm and a thickness of 1 mm.

Next, the shielding performance L (dB) was calculated from the power transmittance $T(\omega)$ obtained through measurement, based on Formula (B) below.

$$L = 10 \times \mathrm{Log}_{10}(T(\omega)/100) \quad \text{(B)}$$

Table 1 shows results of the evaluation of the electromagnetic wave shielding performance L for each sheet.

In Table 1, frequencies in parentheses written for the shielding performance are frequencies used for the performance evaluation. These frequencies are each the one selected from frequencies with which high peaks were observed compared with other portions in the evaluation for the electromagnetic wave shielding performance L, the frequencies being 50 GHz or higher. With Comparative Examples A1 to A6, no large peak was observed at a frequency that was 50 GHz or higher (peak corresponding to noise was not taken into consideration).

TABLE 1

|  | Coil outer diameter l in FIG. 3 μm | Coil winding pitch m in FIG. 3 μm | Coil alignment pitch o in FIG. 3 mm | Coil wire diameter p in FIG. 3 μm | Coil angle θ in FIG. 2 ° | Electromagnetic wave shielding performance L dB |
|---|---|---|---|---|---|---|
| Example A1 | 300 | 60 | 1 | 30 | 81.4 | −10 (170 GHz) |
| Example A2 | 300 | 60 | 2 | 30 | 72.8 | −3 (145 GHz) |
| Example A3 | 300 | 60 | 0.75 | 30 | 72.1 | −22 (179 GHz) |
| Example A4 | 200 | 60 | 0.75 | 30 | 81.0 | −20.6 (282 GHz) |
| Example A5 | 100 | 60 | 0.75 | 30 | 81.2 | −15.5 (648 GHz) |
| Example A6 | 100 | 60 | 0.50 | 30 | 83.4 | −38.4 (637 GHz) |
| Comparative Example A1 | 300 | 60 | 3 | 30 | 23.6 | — |
| Comparative Example A2 | 300 | 60 | 2 | 30 | 10.4 | — |
| Comparative Example A3 | 300 | 60 | 3 | 30 | 10.6 | — |
| Comparative Example A4 | — | — | — | — | — | — |
| Comparative Example A5 | 30 (cylinder outer diameter) | — | 1 (cylinder alignment pitch) | — | 82.7 (cylinder angle) | — |
| Comparative Example A6 | 300 (cylinder outer diameter) | — | 2 (cylinder alignment pitch) | — | 82.8 (cylinder angle) | — |

It can be seen in Table 1 described above that with the sheets of Examples A1 to A6 satisfying the requirements of the embodiments described above, a large electromagnetic wave shielding effect was obtained in any frequency band of 100 GHz or higher, but with the sheets of Comparative Examples A1 to A6 not satisfying the requirements, such an effect was not obtained.

Furthermore, from comparison between Examples A1 and A2 and between Examples A5 and A6, it has been found that a larger electromagnetic wave shielding effect at a frequency of 50 GHz or higher was obtained with a shorter coil alignment pitch.

Furthermore, from comparison between Examples A4 and A5, it has been found that a larger electromagnetic wave shielding effect at a frequency of 50 GHz or higher was obtained with a larger coil outer diameter.

<Experiment B>
<Experiment B1: Evaluation of Actual Sheet>
[Sample Preparation]
<Raw Materials>
Base material 1: A mixture of cold-embedded resin JP-21111001 (a polyester resin with a refractive index of 1.69 at 500 GHz) manufactured by Struers K.K. and a curing agent (M agent) manufactured by Struers K.K. The mixing ratio was cold-embedded resin:curing agent=100 ml:1.5 ml, and the curing time was 40 minutes at room temperature.
Base material 2: Mold resin R4212-2 for semiconductors manufactured by NAGASE & CO., LTD.

The base material 2 was configured by 89 wt. % of silica filler Sift, 10 wt. % of epoxy resin, and others (such as a flame retardant, carbon black, and an ion replenishment agent). The refractive index at 500 GHz was 1.93.
Coil: A coil of a mode in Table 2 described below was used as the coil in each Example.

Example B1

Figure 24:
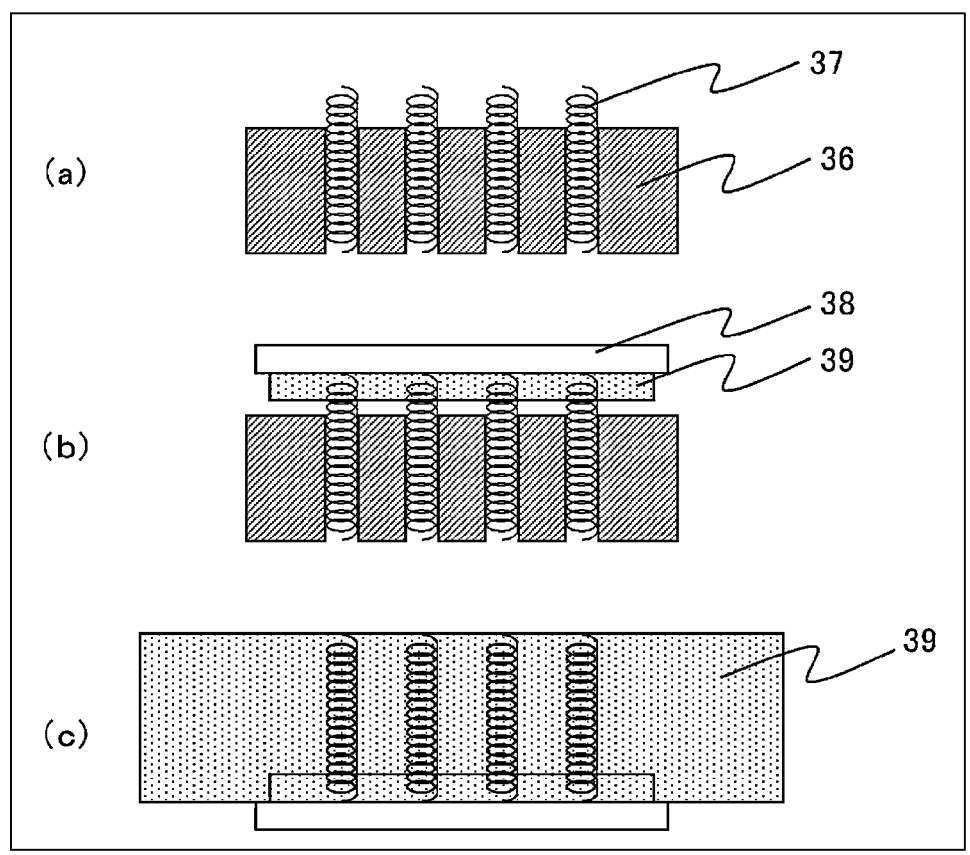
FIG. 24 is a diagram schematically illustrating a method for manufacturing an electromagnetic wave shielding sheet of Example B1.

A mold was prepared in which 40 (vertical)×40 (lateral) pockets (through holes), each having a hole depth of 2 mm and an outer diameter of 350 μm, were arranged at an interval of 0.750 mm between the centers of the holes (a lattice arrangement). Then, double coils 37 were disposed in the holes of this mold 36 as illustrated in FIG. 24, (a). In this case, 34.8 double coils 37 were arranged within a circle of a diameter of 5 mm in the sheet flat surface direction, in an arrangement of 16 (vertical)×16 (lateral). The double coils 37 were each made of a metal wire with a circular cross section. The thickness (wire diameter) of the metal wire was 30 μm. The outer diameter of the large spiral was 300 μm. The winding pitch width of the large spiral was 180 μm. The outer diameter of the small spiral was 90 μm. The winding pitch width of the small spiral was 60 μm. The coil alignment pitch was the distance between the centers of the holes of the pockets described above. While the length of the double coil used in the center axis direction of the large spiral was 3 mm, the double coil was ground to have a length of 2 mm in the thickness direction of the sheet in the final sheet grinding step. The metal wire was made of tungsten.

Then, as illustrated in FIG. 24, (b), a silicon plate 38 coated with resin 39 including the base material 1 described above was arranged with the resin 39 being in contact with the double coils 37. The resin 39 was left at a room temperature for 40 minutes to be cured. Thus, the double coils 37 were fixed to the resin 39. Then, the double coils 37 were removed from the mold 36. Then, in the state where the double coils were fixed, the resin 39 was poured in and was heated to be cured. Thus, a sheet (30 mm (vertical)×30 mm (lateral)) was prepared as illustrated in FIG. 24, (c). The heating for the curing to obtain the cured sheet was performed at a room temperature for 40 minutes. The double coils in the lattice arrangement were placed at the center of the sheet, with the center of the lattice arrangement overlapping the center of the sheet.

Finally, the silicon plate 38 was removed, and the sheet was ground to have a thickness of 2 mm. Thus, the sheet 1 having a thickness of 2 mm was obtained. The average angle between the center axes of the large spirals of the double coils and the sheet flat surface direction was 85.4°. The average weight per double coil was 0.000180 g. The content of the double coils in the sheet 1 was 0.2295 g/cm$^3$.

Example B2

Double coils that are the same as those used in Example B1 were mixed in the base material 1. The resultant mixture was poured into a mold with which a sheet of an overall size of 30 mm (vertical)×30 mm (lateral) was able to be prepared. In this case, 573 double coils were arranged with three double coils stacked at a plurality of portions (with a plurality of stacks of three coils), and with 12.5 double coils arranged within a circle with a diameter of 5 mm in the sheet flat surface direction. Then, the base material 1 was cured under a condition that is the same as that for the base material 1 in Example 1, and the resultant object was ground to have a thickness of 2 mm. Thus, the sheet 2 having a thickness of 2 mm was obtained. In this case, the double coils in the base material 1 settled in the resin. Most of the double coils were knocked down in the flat surface direction. The base material 1 in this state was cured. The average angle between the center axes of the large spirals of the double coils and the flat surface direction of the sheet was 4.4°. The content of the double coils in the sheet 2 was 1.1619 g/cm$^3$. In Example 1, the final length of the double coil in the center axis direction of the large spiral was 2 mm in the thickness of the sheet due to the grinding of the sheet. In this Example B2, the double coil was substantially knocked down horizontally, and the double coil was not ground. Thus, the length of the double coil in the resin in the center axis direction of the large spiral was 3 mm, which was the original length.

The electromagnetic wave shielding performance L of −13.1 dB was obtained at 520 GHz as a result of the evaluation of the electromagnetic wave shielding property described below using the sheet 2 described above. In this mode, an average of three double coils were stacked. Thus, the thickness of the double coils in the thickness direction of the sheet was substantially 300 μm×3 layers=900 μm. Since the resin has almost no impact on the electromagnetic wave shielding property, the value −13.1 dB of the electromagnetic wave shielding performance L described above can be regarded as the electromagnetic wave shielding performance L when double coils were stacked up to 900 μm high in the thickness direction of the sheet. Thus, the electromagnetic wave shielding performance L in a mode in which double coils were stacked up to 2 mm high in the thickness direction of the sheet was −13.1×(2000 μm/900 μm)=−29.1 dB. Table 2 below shows the electromagnetic wave shielding performance L in this mode in which double coils are stacked up to 2 mm high.

Comparative Example B1

A sheet 3 of a size 30 mm (vertical)×30 mm (lateral)×2 mm (thickness) was obtained by curing the base material 1 under a condition that is the same as the resin curing condition in Example B1 described above, without using the metal coils.

Comparative Example B2

A sheet was prepared through the following operation using a wire bonder manufactured by Hesse Mechatronics Inc. First of all, as illustrated in FIG. 19, (a) and FIG. 19, (b), metal coils (single coils) 42 made of copper that have the thickness (wire diameter), the outer diameter, and the winding pitch width that are the same as those in Example B1, as well as a length of 1 mm in the center axis direction, were arranged in parallel to form 15 lines on an aluminum plate 41. Then, each of the single coils was struck by a wedge tool 43 at an interval of 3 mm. Thus, the single coils were partially crushed. Then, as illustrated in FIG. 19, (c), tweezers were put below the uncrushed portion, to lift the portion, and this state was held (the single coils in this state are referred to as continuously horizontal coils). The number of single coils was the number of the uncrushed portions that are in a 30 (vertical)×30 (lattice) lattice arrangement, with the vertical direction being the center axis direction of the single coil. The length of the single coils in the center axis direction was the length of the uncrushed portion, and was 0.7333 mm. The coil alignment pitch is the interval of striking by the wedge tool, and was 3 mm.

Then, the above-described base material 2 was poured onto the aluminum plate to include the continuous horizontal coil described above, cured under the condition that is the same as the resin curing condition in Example B1, and then the resultant sheet was peeled from the aluminum plate, whereby the cured sheet was obtained. The sheet thus prepared had an overall size of 3 cm×3 cm. Finally, the cured sheet thus obtained was ground to have a thickness of 1 mm. Thus, a sheet 4 having a thickness of 1 mm was obtained. The average winding number of the single coils was 17, the average angle between the center axes of the single coils and the flat surface direction of the sheet 8 was 10.6°, and the content of the single coils in the sheet 4 was 0.0205 g/cm$^3$. The sheet 4 was prepared with the single coils in the lattice arrangement placed at the center of the sheet, that is, with the center of the lattice arrangement overlapping the center of the sheet.

In Table 2, the winding pitch width and the outer diameter of the single coils are respectively in the fields of large spiral winding pitch width and large spiral outer diameter.

[Evaluation of Characteristics]

(Electromagnetic Wave Shielding Property)

The electromagnetic wave shielding property was evaluated by measuring the power transmittance T(ω) using a terahertz spectroscopy system (TAS 7500 TSH manufactured by Advantest Corporation). An aperture with a diameter of 5 mm was used. A measurement target sample was obtained by cutting each of the sheets described above into rectangular parallelepiped bodies with a length of one side of 30 mm and a thickness of 1 mm.

Next, the shielding performance L (dB) was calculated from the power transmittance T (ω) obtained through measurement, based on Formula (B) below.

$$L = 10 \times \text{Log}_{10}(T(\omega)/100) \quad (B)$$

Table 2 below shows results of the evaluation of the electromagnetic wave shielding performance L for each sheet. In Table 2, frequencies in parentheses written for the shielding performance L are frequencies used for the performance evaluation. The frequencies are each the one selected from frequencies with which high peaks were observed compared with other portions in the evaluation for the electromagnetic wave shielding performance L, the frequencies being on the relatively high frequency side. With Comparative Examples B1 and B2, no large peak was observed in a high frequency band (peak corresponding to noise was not taken into consideration).

TABLE 2

|  | Wire diameter r in FIG. 23 μm | Large spiral outer diameter l in FIG. 23 μm | Large spiral winding pitch width m in FIG. 23 μm | Small spiral outer diameter p in FIG. 23 μm | Small spiral winding pitch width q in FIG. 23 μm | Large spiral center axis angle θ in FIG. 2 ° | Coil alignment pitch o in FIG. 23 mm | Electromagnetic wave shielding performance L dB |
|---|---|---|---|---|---|---|---|---|
| Example B1 | 30 | 300 | 180 | 90 | 60 | 85.4 | 0.750 | −18.6 (520 GHz) |
| Example B2 | 30 | 300 | 180 | 90 | 60 | 4.4 | — | −29.1 (610 GHz) |
| Comparative Example B1 | — | — | — | — | — | — | — | — |
| Comparative Example B2 | 30 | 300 | 60 | — | — | 10.6 | 3 | — |

It can be seen in Table 2 described above that with the sheets of Examples B1 and B2 satisfying the requirements of the embodiments described above, a large electromagnetic wave shielding effect was obtained in a high frequency band exceeding 100 GHz, but with the sheets of Comparative Examples B1 and B2 not satisfying the requirements, such an effect was not obtained. With each of Examples B1 and B2, the electromagnetic wave shielding effect was obtained in an extremely high frequency band that is 500 GHz or higher. Thus, these sheets are not only applicable to applications requiring electromagnetic wave shielding in such a frequency band, but also suitably applicable to cell phones and smartphones of the next generation expected to be used in a very high frequency band.

It can be seen that the sheet of Example B2 with the double coils arranged horizontally features excellent electromagnetic wave shielding property, compared with the sheet of Example B1 with the double coils arranged perpendicularly.

Reference Experiment B1: Simulation Evaluation (Double Coil)

A simulation experiment was performed to evaluate the electromagnetic wave shielding effect of a sheet including the double coil, using ANSYS HFSS (registered trademark), which is full wave 3D electromagnetic field software manufactured by CYBERNET SYSTEMS CO., LTD. The result of "Experiment A1: Simulation evaluation" described above can be used for the evaluation of the electromagnetic wave shielding effect of the sheet including the single coils.

[Perpendicular Direction Experiment]

Figure 25:
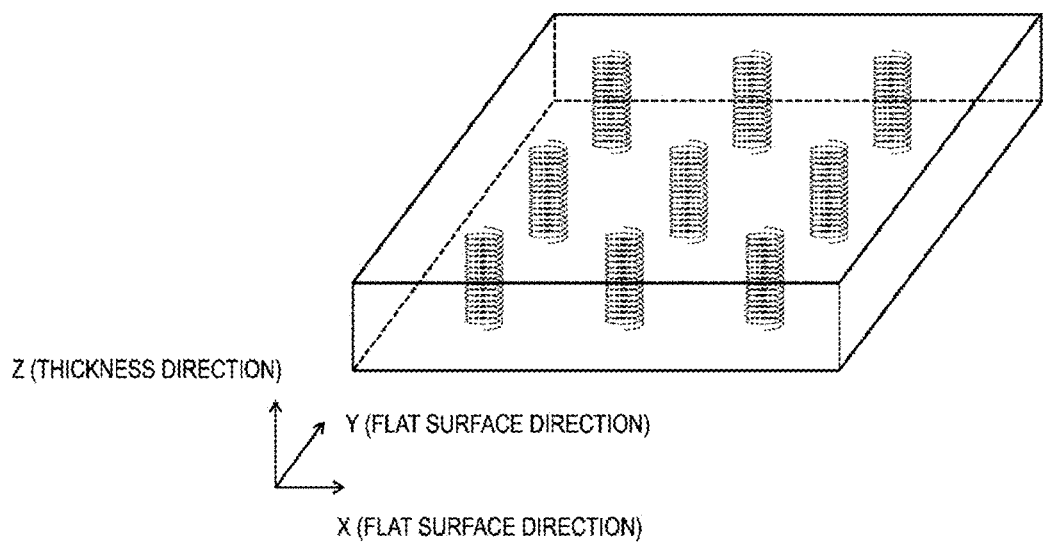
FIG. 25 is a diagram illustrating an embodiment of a simulation for Reference Experiment B1 (perpendicular direction experiment) of Example.

As illustrated in FIG. 25, a simulation experiment was performed for a case where the double coils were arranged in the sheet, and thus the sheet flat surface direction and the center axes of the large spirals of the double coils form a right angle. In this experiment, the following conditions and conditions in Table 3 below were applied. The electromagnetic waves propagate in a direction from the upper side toward the lower side (−Z direction), relative to the thickness direction of the sheet. The polarization direction of the electric field of the incident electromagnetic waves was defined as the X-axis direction, and the polarization direction of the magnetic field was defined as the Y-axis direction.

Figure 26:
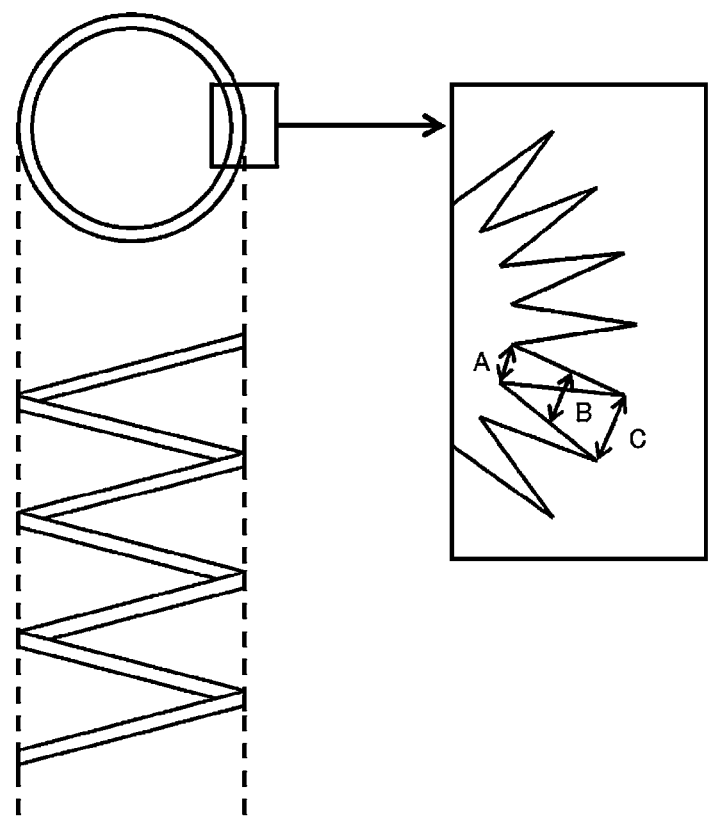
FIG. 26 is a diagram illustrating parameters A to C for Reference Experiment B1 (perpendicular direction experiment) of Example.

A to C in Table 3 are parameters shown in FIG. 26. Specifically, when the side of the center axis direction of the large spiral is the inner side, A is the coil winding pitch width on the inner side of the small spiral, C is the coil winding pitch width on the outer side of the small spiral, and B is the coil winding pitch width at a point between these. The average winding pitch width q of the small spiral described above corresponds to C described above.

Substrate material: epoxy resin (real part of permittivity was 3.65 and imaginary part of permittivity was 0.05)

Tungsten coil plasma angular frequency ($\omega_p$): $9.71 \times 10^{15}$ rad/s Tungsten coil damping angular frequency ($\omega_\tau$) $9.15 \times 10^{15}$ rad/s Initial mesh resolution: Coarse Average length of the double coils in the center axis direction of the large spiral: 2 mm (same as the thickness of the resin)

Figure 27:
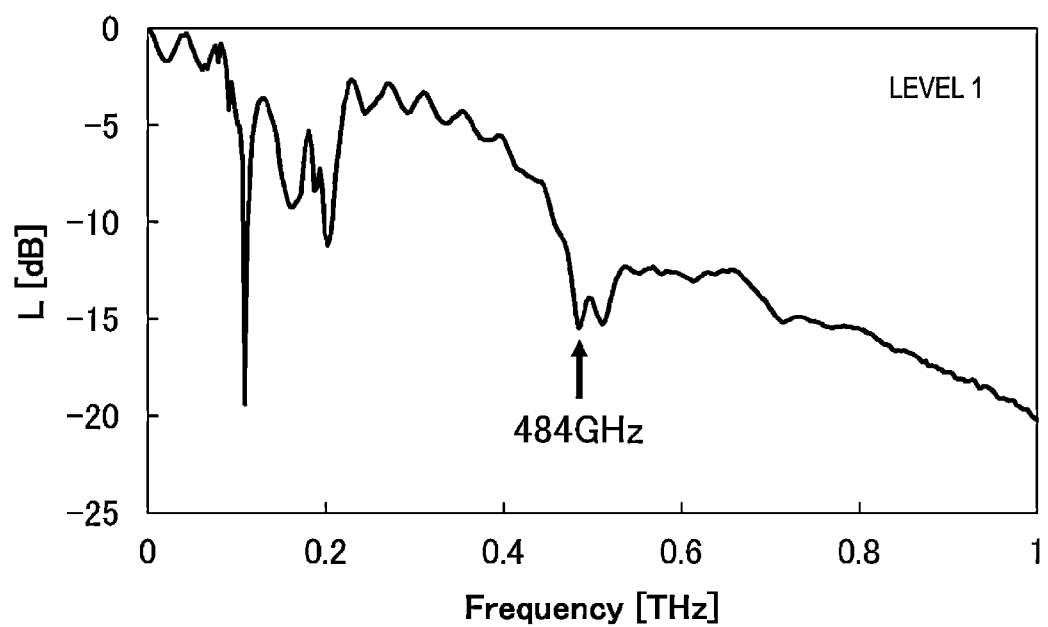
FIG. 27 is a diagram showing a result of the simulation for level 1 of Reference Experiment B1 (perpendicular direction experiment) of Example.

As in Experiment 1 described above, the shielding property in Table 3 was evaluated with the electromagnetic wave shielding performance L calculated using Formulae (A) and (B) described above, and the frequencies in the parentheses are the frequencies used for the evaluation of the performance. The frequencies are each the one selected from frequencies with which higher peaks were observed than those of other portions in the evaluation for the electromagnetic wave shielding performance L, the frequencies being on the relatively high frequency side. FIG. 27 is a graph showing a change in the electromagnetic wave shielding performance L relative to the frequencies of the electromagnetic waves for Level 1.

TABLE 3

|  | Wire diameter μm | Small spiral outer diameter μm | Small spiral winding pitch width μm | Large spiral outer diameter μm | Large spiral winding pitch width μm | In A μm | Mid B μm | Out C μm | Interval μm | Coil alignment pitch μm | Resin thickness mm | Electromagnetic wave shielding performance L dB |
|---|---|---|---|---|---|---|---|---|---|---|---|---|
| Level 1 | 30 | 90 | 30 | 300 | 90 | 10.0 | 22.5 | 45.0 | 450 | 750 | 2 | −15.4 (484 GHz) |
| Level 2 | 30 | 150 | 30 | 450 | 150 | 6.0 | 30.0 | 54.0 | 450 | 900 | 2 | −28.2 (292 GHz) |
| Level 3 | 30 | 200 | 30 | 600 | 200 | 4.5 | 30.1 | 55.6 | 450 | 1050 | 2 | −28.4 (232 GHz) |
| Level 4 | 30 | 250 | 30 | 750 | 250 | 3.8 | 30.4 | 57.0 | 450 | 1200 | 2 | −30.4 (190 GHz) |

[Horizontal Direction Experiment]

Figure 28:
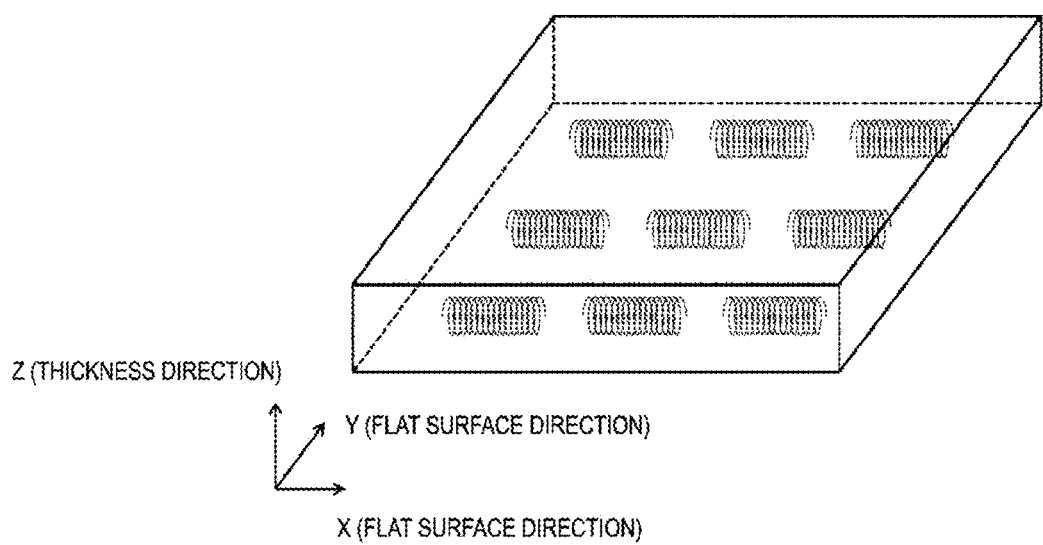
FIG. 28 is a diagram illustrating an embodiment of a simulation for Reference Experiment B1 (horizontal direction experiment) of Example.

As illustrated in FIG. 28, a simulation experiment was performed for a case where the double coils were arranged in the sheet, and thus the sheet flat surface direction and the center axes of the large spirals of the double coils form a horizontal angle.

In this experiment, the following conditions and conditions in Table 4 below were applied. The electromagnetic waves propagate in a direction from the upper side toward the lower side (−Z direction), relative to the thickness direction of the sheet. The polarization direction of the electric field of the incident electromagnetic waves was defined as the X-axis direction, and the polarization direction of the magnetic field was defined as the Y-axis direction.

Figure 29:
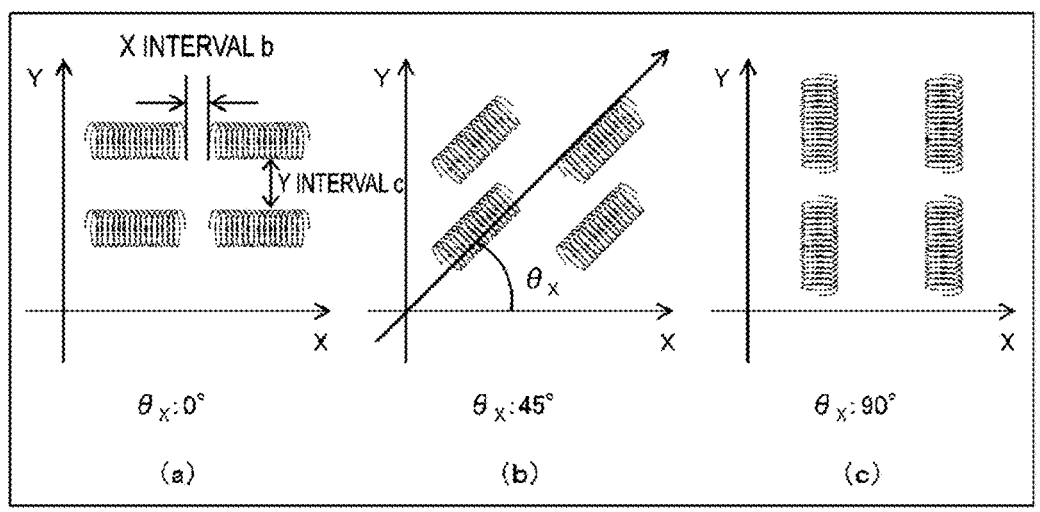
FIG. 29 is a diagram illustrating a parameter Ox for Reference Experiment B1 (horizontal direction experiment) of Example.

A to C in Table 4 are the same as A to C in the perpendicular direction experiment described above. Furthermore, θx in Table 4 is an angle formed between the center axes of the large spirals of the double coils and the X axis as illustrated in FIG. 29.

Substrate material: epoxy resin (real part of permittivity was 3.65 and imaginary part of permittivity was 0.05)

Tungsten coil plasma angular frequency ($\omega_p$): $9.71 \times 10^{15}$ rad/s Tungsten coil damping angular frequency ($\omega_\tau$) $9.15 \times 10^{15}$ rad/s Initial mesh resolution: Coarse Average length of the double coils in the center axis direction of the large spiral: 2 mm (same as the thickness of the resin)

Figure 30:
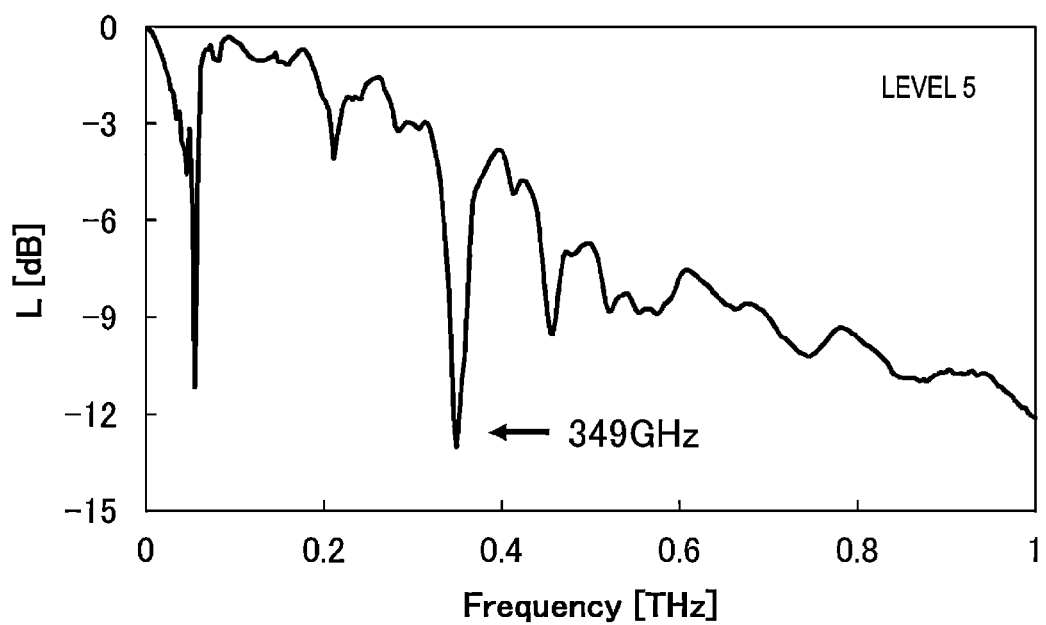
FIG. 30 is a diagram showing a result of the simulation for level 5 of Reference Experiment B1 (horizontal direction experiment) of Example.

As in Experiment 1 described above, the shielding property in Table 4 was evaluated with the electromagnetic wave shielding performance L calculated using Formulae (A) and (B) described above, and the frequencies in the parentheses are the frequencies used for the evaluation of the performance. The frequencies are each the one selected from frequencies with which high peaks were observed compared with other portions in the evaluation for the electromagnetic wave shielding performance L, the frequencies being on the relatively high frequency side. FIG. 30 is a graph showing a change in the electromagnetic wave shielding performance L relative to the frequencies of the electromagnetic waves for Level 5.

TABLE 4

|  | Wire diameter μm | Small spiral outer diameter μm | Small spiral winding pitch width μm | Large spiral outer diameter μm | Large spiral winding pitch width μm | In A μm | Mid B μm | Out C μm | X interval b μm | Y interval c μm | Resin thickness mm | Angle θ$_X$ with respect to X axis ° | Electromagnetic wave shielding performance L dB |
|---|---|---|---|---|---|---|---|---|---|---|---|---|---|
| Level 5 | 30 | 150 | 30 | 450 | 150 | 6.0 | 30.0 | 54.0 | 450 | 450 | 1 | 0 | −12.9 (349 GHz) |
| Level 6 | 30 | 150 | 30 | 450 | 150 | 6.0 | 30.0 | 54.0 | 1000 | 1000 | 1 | 0 | −6.49 (340 GHz) |
| Level 7 | 30 | 150 | 30 | 450 | 150 | 6.0 | 30.0 | 54.0 | 450 | 450 | 1 | 45 | −10.2 (349 GHz) |
| Level 8 | 30 | 150 | 30 | 450 | 150 | 6.0 | 30.0 | 54.0 | 450 | 450 | 1 | 90 | −8.1 (349 GHz) |

It can be seen in Tables 3 and 4 above that the electromagnetic wave shielding effect can be obtained in a high frequency band regardless of whether a right angle is formed or a horizontal angle is formed between the sheet flat surface direction and the center axis direction of the large spiral of the double coil.

As described above, the present disclosure can provide an electromagnetic wave shield that can block electromagnetic waves in a high frequency band, and a method for manufacturing the same.

REFERENCE SIGNS LIST

1 Air
2 Substrate
3 Copper coil
10 Pocket resin sheet
11 Resin
12 Conductive member
13 Pocket
20 Resin sheet including C-shaped conductive material
21 Resin
22 C-shaped conductive material
23 Column-shaped conductive material
31 Support body A
32 Conductive member
33 Support body B
34 Cured object of resin composition S
35 Cured object of resin composition T
36 Mold
37 Conductive coil (double coil)
38 Silicon plate
39 Resin
41 Aluminum plate
42 Metal coil
43 Wedge tool
G Large spiral center axis
H Small spiral center axis

The invention claimed is:

1. A resin molded body comprising:
resin; and
a conductive member having a coil shape with a center axis, wherein the number of conductive members in the resin molded body is 5 members/cm$^2$ or greater;
with a flat surface in at least part of the resin molded body, wherein an average angle between the flat surface and the center axis is 50° or greater.

2. The resin molded body according to claim 1, wherein the coil shape is a spiral shape.

3. The resin molded body according to claim 2, wherein the conductive member is a metal coil.

4. The resin molded body according to claim 1, wherein the conductive member includes a plurality of C-shaped conductive materials, and a column-shaped conductive material coupling end portions of the plurality of C-shaped conductive materials in a direction of the center axis.

5. The resin molded body according to claim 1, wherein a content of the conductive member in the resin molded body is 0.00040 g/cm$^3$ or greater and 5.50 g/cm$^3$ or less.

6. The resin molded body according to claim 1, wherein the resin molded body has a sheet shape.

7. The resin molded body according to claim 6, wherein the resin molded body is an electromagnetic wave shielding sheet.

8. An electric communication device comprising the resin molded body according to claim 1.

9. A method for manufacturing a resin molded body that includes resin and a conductive member having a coil shape with a center axis, wherein the number of conductive members in the resin molded body is 5 members/cm$^2$ or greater, with a flat surface in at least part of the resin molded body, the method comprising:
preparing a resin member including a pocket and a flat surface in at least part of the resin member;
arranging, in the pocket, the conductive member oriented; and
pouring a composition including resin into the pocket in which the conductive member is arranged, and then curing the composition, wherein
an average angle between the flat surface and the center axis is 50° or greater.

10. The method for manufacturing a resin molded body according to claim 9, wherein the resin molded body has a sheet shape.

11. The method for manufacturing a resin molded body according to claim 10, wherein the resin molded body is an electromagnetic wave shielding sheet.

12. A method for manufacturing a resin molded body that includes resin and a conductive member having a coil shape with a center axis, with a flat surface in at least part of the resin molded body, the method comprising:
preparing a plurality of resin sheets each including the resin, a C-shaped conductive material, and a column-shaped conductive material connected to an end portion of the C shape; and
layering the plurality of resin sheets, with the end portion of the C-shaped conductive material in one of the sheets being in contact with the column-shaped conductive material in another one of the sheets in a direction of the center axis,
wherein the number of conductive members in the resin molded body is 5 members/cm$^2$ or greater.

13. A method for manufacturing a resin molded body that includes resin and a conductive member having a coil shape with a center axis, wherein the number of conductive members in the resin molded body is 5 members/cm$^2$ or greater, with a flat surface in at least part of the resin molded body, the method comprising:
preparing a composition including a resin composition including the resin and the conductive member;
orienting the conductive member to achieve an average angle of 50° or greater between a flat surface direction of the sheet and the center axis; and
curing the resin composition including the conductive member while holding the orientation of the conductive member.

14. A resin molded body comprising:
resin; and
a conductive coil, wherein
a conductive member forming the conductive coil has a spiral shape, and
the center axis of the conductive coil has a spiral shape formed into a spiral shape.

15. The resin molded body according to claim 14, wherein a content of the conductive coil in the resin molded body is 0.02 g/cm$^3$ or greater and less than 5.00 g/cm$^3$.

16. The resin molded body according to claim 14, wherein the resin molded body has a sheet shape.

17. The resin molded body according to claim 16, wherein the resin molded body is an electromagnetic wave shielding sheet.

18. The resin molded body according to claim 14, wherein an average outer diameter of the conductive coil is from 50 to 500 µm.

19. The resin molded body according to claim 14, wherein a content of the conductive coil in the resin molded body is 0.20 g/cm³ or greater and less than 1.50 g/cm³.

20. The resin molded body according to claim 14, wherein the resin molded body blocks electromagnetic waves at a frequency of 100 GHz or higher.

21. A method for manufacturing a resin molded body that includes resin and a conductive coil, the method comprising:
preparing a composition including a resin composition including the resin, and the conductive coil, and then curing the composition, wherein
a conductive member forming the conductive coil has a spiral shape, and the center axis of the conductive coil has a spiral shape formed into a spiral shape.

22. The method for manufacturing a resin molded body according to claim 21, wherein the resin molded body has a sheet shape.

23. The method for manufacturing a resin molded body according to claim 22, wherein the resin molded body is an electromagnetic wave shielding sheet.

24. The method for manufacturing a resin molded body according to claim 21, wherein the resin composition further comprises a curing agent from about 0.05 to 15 wt. %.

25. The method for manufacturing a resin molded body according to claim 21, wherein an average outer diameter of the conductive coil is from 50 to 500 µm.

26. A composition for a resin molded body comprising:
resin; and
a conductive coil, wherein
a conductive member forming the conductive coil has a spiral shape, and
the center axis of the conductive coil has a spiral shape formed into a spiral shape.

27. The composition for a resin molded body according to claim 26, wherein the composition is a composition for an electromagnetic wave shielding sheet.

28. The composition for a resin molded body according to claim 26, wherein the resin composition further comprises a curing agent from about 0.05 to 15 wt. %.

29. The composition for a resin molded body according to claim 26, wherein an average outer diameter of the conductive coil is from 50 to 500 µm.

* * * * *